United States Patent
Watanabe et al.

(10) Patent No.: US 10,164,036 B2
(45) Date of Patent: Dec. 25, 2018

(54) SEMICONDUCTOR DEVICE

(71) Applicant: Renesas Electronics Corporation, Tokyo (JP)

(72) Inventors: Tetsuya Watanabe, Tokyo (JP); Mitsuru Miyamori, Tokyo (JP); Katsumi Tsuneno, Tokyo (JP); Takashi Shimizu, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/796,076

(22) Filed: Oct. 27, 2017

(65) Prior Publication Data

US 2018/0047820 A1 Feb. 15, 2018

Related U.S. Application Data

(62) Division of application No. 15/432,463, filed on Feb. 14, 2017, now Pat. No. 9,837,501, which is a division
(Continued)

(30) Foreign Application Priority Data

Aug. 22, 2014 (JP) .................................. 2014-169834

(51) Int. Cl.
*H01L 29/417* (2006.01)
*H01L 29/78* (2006.01)
(Continued)

(52) U.S. Cl.
CPC .... *H01L 29/41791* (2013.01); *H01L 23/5226* (2013.01); *H01L 29/0657* (2013.01);
(Continued)

(58) Field of Classification Search
None
See application file for complete search history.

(56) References Cited

U.S. PATENT DOCUMENTS 7,348,642 B2  3/2008  Nowak
7,352,037 B2  4/2008  Kim et al.
(Continued)

FOREIGN PATENT DOCUMENTS

JP   2003-142681 A   5/2003
WO  2005/036651 A1  4/2005
(Continued)

OTHER PUBLICATIONS

Communication dated Feb. 27, 2018 from the Japanese Patent Office in counterpart application No. 2014-169834.
(Continued)

*Primary Examiner* — Michael Lebentritt
*Assistant Examiner* — Jordan Klein
(74) *Attorney, Agent, or Firm* — Sughrue Mion, PLLC

(57) ABSTRACT

The semiconductor device including: two fins having rectangular parallelepiped shapes arranged in parallel in X-direction; and a gate electrode arranged thereon via a gate insulating film and extending in Y-direction is configured as follows. First, a drain plug is provided over a drain region located on one side of the gate electrode and extending in Y-direction. Then, two source plugs are provided over a source region located on the other side of the gate electrode and extending in Y-direction. Also, the drain plug is arranged in a displaced manner so that its position in Y-direction may not overlap with the two source plugs. According to such a configuration, the gate-drain capacitance can be made smaller than the gate-source capacitance and a Miller effect-based circuit delay can be suppressed. Further, as compared with capacitance on the drain side, capacitance on the source
(Continued)

side increases, thereby improving stability of circuit operation.

7 Claims, 27 Drawing Sheets

Related U.S. Application Data of application No. 14/822,166, filed on Aug. 10, 2015, now Pat. No. 9,620,602.

(51) Int. Cl.
*H01L 23/522* (2006.01)
*H01L 29/06* (2006.01)

(52) U.S. Cl.
CPC ......... *H01L 29/785* (2013.01); *H05K 999/99* (2013.01); *H01L 2029/7858* (2013.01); *H01L 2924/13067* (2013.01)

(56) References Cited

U.S. PATENT DOCUMENTS

| 7,719,043 | B2* | 5/2010 | Yamagami | H01L 21/823807 257/306 |
|---|---|---|---|---|
| 7,968,394 | B2 | 6/2011 | Orlowski et al. | |
| 2004/0036127 | A1* | 2/2004 | Chau | B82Y 10/00 257/401 |
| 2005/0040444 | A1 | 2/2005 | Cohen | |
| 2005/0242395 | A1* | 11/2005 | Chen | H01L 29/66628 257/347 |
| 2006/0289940 | A1 | 12/2006 | Hyun et al. | |
| 2007/0001219 | A1* | 1/2007 | Radosavljevic | H01L 29/41791 257/327 |
| 2007/0132009 | A1* | 6/2007 | Takeuchi | H01L 21/845 257/321 |
| 2007/0235819 | A1* | 10/2007 | Yagishita | H01L 29/66636 257/401 |
| 2008/0251849 | A1* | 10/2008 | Yamagami | H01L 29/41791 257/368 |
| 2013/0049115 | A1* | 2/2013 | Cheng | H01L 29/66803 257/347 |
| 2015/0060772 | A1 | 3/2015 | Miyata | |

FOREIGN PATENT DOCUMENTS

| WO | 2005/091374 A1 | 9/2005 |
|---|---|---|
| WO | 2007/019023 A2 | 2/2007 |

OTHER PUBLICATIONS

Communication dated Oct. 29, 2018 from the Taiwanese Intellectual Property Office in counterpart application No. 104126660.

* cited by examiner

SEMICONDUCTOR DEVICE

CROSS-REFERENCE TO RELATED APPLICATIONS

This application is a divisional of U.S. patent application Ser. No. 15/432,463, filed Feb. 14, 2017 and Ser. No. 14/822,166 filed Aug. 10, 2015, which claims priority to Japanese Patent Application No. 2014-169834, filed Aug. 22, 2014, the contents of all of which are incorporated herein by reference.

BACKGROUND

The present invention relates to a semiconductor device and, in particular, it relates to a technique effectively applicable to a semiconductor device having a FINFET.

In these years, in LSI (Large Scale Integration) using silicon, the dimension of a MISFET (Metal Insulator Semiconductor Field Effect Transistor) being a component thereof, particularly the gate length of a gate electrode has been decreasing steadily. The miniaturization of the MISFET has been advanced in a style conforming to the scaling law but, with respective progresses of the device generation, various problems have appeared, and it has becomes difficult to satisfy both the suppression of the short channel effect and the securing of a high-current driving capability of the MISFET. Consequently, research and development for new structure devices, which may replace the ordinary planer type MISFET, are being actively conducted.

The FINFET is one of the aforementioned new structure devices, and is a three dimensional configuration MISFET differing from the planer type MISFET.

For example, Patent Document 1 below discloses a FINFET in which fin resistance between a gate and a source region becomes small and capacitance between the gate and a drain region becomes small. To be specific, there is illustrated the FINFET in which a gate conductor is arranged over a fin at a position closer to the source region than to the drain region.

PATENT DOCUMENT 1

International Publication No. WO2007/019023

SUMMARY

The present inventors are engaged in research and development of the semiconductor device having a FINFET described above, and are actively studying as to the improvement of its characteristics. In the course of the study, it has been found that there is room for further improvement in the configuration of the semiconductor device having the FINFET.

The aforementioned and other purposes and novel features of the present invention will be made clear from the description of the present specification and the attached drawings.

The following explains briefly the outline of a typical invention among the inventions disclosed in the present application.

The semiconductor device according to one embodiment disclosed in the present application includes: a first fin and a second fin having rectangular parallelepiped shapes being arranged in parallel to each other in a first direction; and a gate electrode arranged over the first and second fins via a gate insulating film and extending in a second direction. The semiconductor device further includes: a first drain plug formed over a drain region located on one side of the gate electrode and extending in a second direction; and first and second source plugs formed over a source region located on the other side of the gate electrode and extending in a second direction. Also, the first drain plug is arranged in a displaced manner so that its position in the second direction may not overlap with the first source plug or the second source plug.

According to the semiconductor device of a typical embodiment disclosed in the present application, its characteristics can be improved.

DETAILED DESCRIPTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, an application example, detailed explanation, or a supplementary explanation thereof. Also, in the embodiments described below, when referring to the number of elements or others (including number of pieces, numeric value, amount, range, and the like), the number of the elements is not limited to a specific number unless otherwise stated or except the case where the number is apparently limited to a specific number in principle. The number larger or smaller than the specific number is also applicable.

Further, in the embodiments described below, it goes without saying that components (including element steps) are not always indispensable unless otherwise stated or except the case where the components are apparently indispensable in principle. Similarly, in the embodiments described below, when the shape of the components or others, positional relation thereof, and the like are mentioned, the substantially approximate and similar shapes and the like are included therein unless otherwise stated or except for the case where it is conceivable that they are apparently excluded in principle. The same is true of the above-described number or others (including the number of pieces, the numerical value, the amount, the range, and the like).

Hereinafter, embodiments of the present invention will be described in detail with reference to the accompanying drawings. Also, components having the same function are denoted by the same or related symbols throughout all drawings for describing the embodiments, and the repetitive description thereof will be omitted. Further, when two or more similar components (portions) exist, an individual or specific portion will be described by adding a symbol to a collective term in some cases. Still further, the description of the same or similar portions is not repeated in principle unless particularly required in the embodiments described above.

Also, in some drawings used in the embodiments, hatching is omitted even in a cross-sectional view so as to make the drawings easy to see in some cases. Further, hatching is used even in a plan view so as to make the drawings easy to see in some cases.

Moreover, in a cross-sectional view and a plan view, a size of each portion does not correspond to that of an actual device, but is as illustrating a specific portion to be relatively large in some cases so as to easily understand the drawings. Also in a case where the plan view and the cross-sectional view correspond to each other, the size of the portion is changed for the illustration in some cases.

Figure 1:
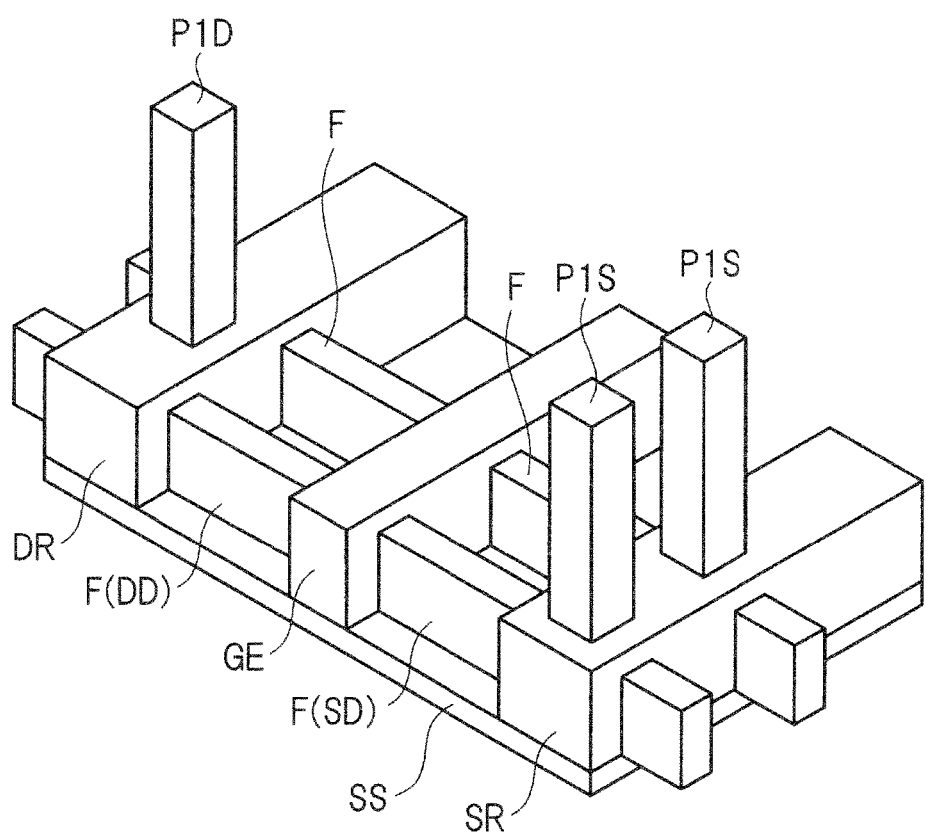
FIG. 1 is a perspective view schematically showing a configuration of a semiconductor device of First Embodiment.
Figure 2:
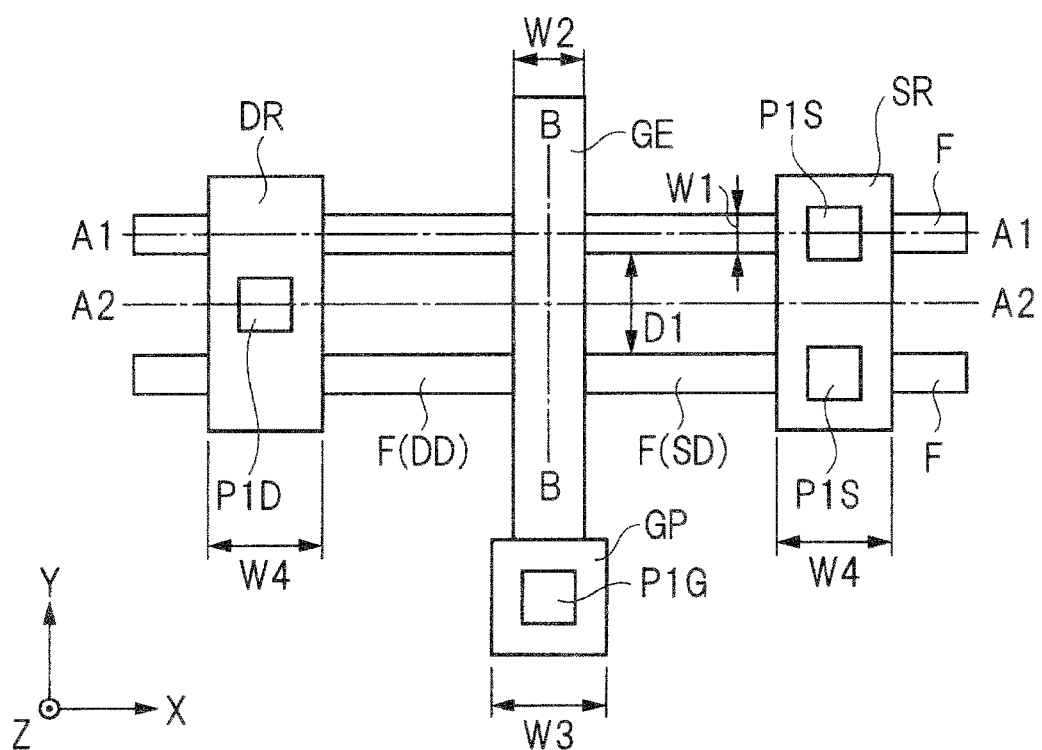
FIG. 2 is a plan view showing the configuration of the semiconductor device of First Embodiment.
Figure 3:
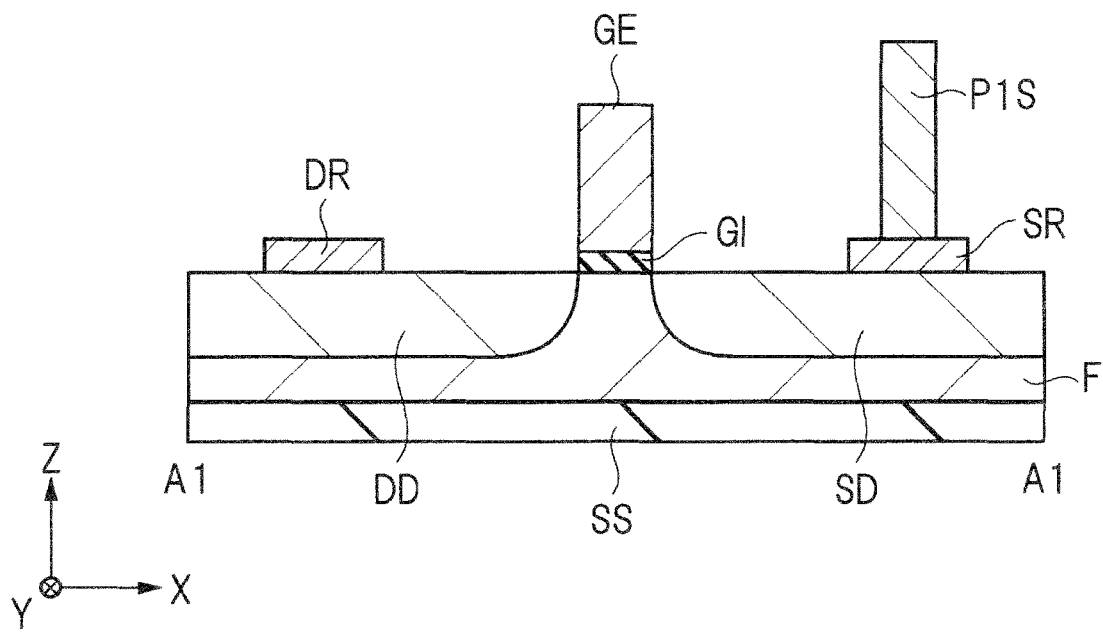
FIG. 3 is a cross-sectional view showing the configuration of the semiconductor device of First Embodiment.
Figure 4:
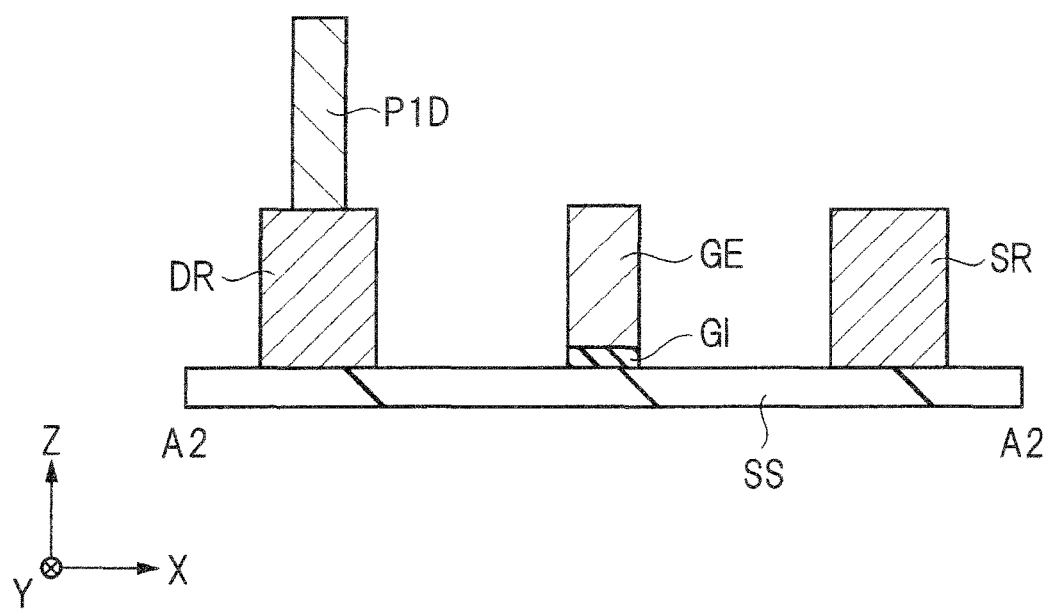
FIG. 4 is a cross-sectional view showing the configuration of the semiconductor device of First Embodiment.
Figure 5:
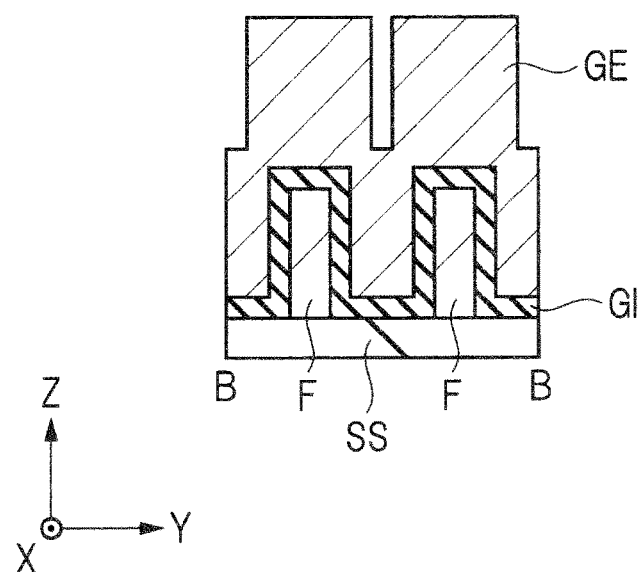
FIG. 5 is a cross-sectional view showing the configuration of the semiconductor device of First Embodiment.

(First Embodiment) Hereinafter, with reference to the drawings, the semiconductor device of the present embodiment will be explained in detail. The semiconductor device of the present embodiment has a FINFET as a semiconductor element. FIG. 1 is a perspective view schematically showing the configuration of the semiconductor device of the present embodiment. FIG. 2 is a plan view showing the configuration of the semiconductor device of the present embodiment. FIGS. 3 to 5 are cross-sectional views showing the configuration of the semiconductor device of the present embodiment. For example, the cross-sectional view of FIG. 3 corresponds to a cross-section taken along line A1-A1 in the plan view of FIG. 2, the cross-sectional view of FIG. 4 corresponds to a cross-section taken along line A2-A2 in the plan view of FIG. 2, and the cross-sectional view of FIG. 5 corresponds to a cross-section taken along line B-B in the plan view of FIG. 2.

[Explanation of Configuration] With reference to FIGS. 1 to 5, a characteristic configuration of the semiconductor device of the present embodiment will be explained.

The semiconductor device of the present embodiment has a FINFET formed over a main surface of a fin F containing a semiconductor layer over a supporting substrate SS.

The FINFET includes: a gate electrode GE arranged over the fin (convex portion) F via a gate insulating film GI; and a source diffusion layer SD and a drain diffusion layer DD formed in the fin F on both sides of the gate electrode GE (see FIG. 3).

Thus, by arranging the gate electrode GE so as to straddle the fin F having a rectangular parallelepiped shape, both side surfaces of the fin F can serve as the channel region (see FIG. 1). In this regard, the "rectangular parallelepiped shape" includes, for example, one whose side surface is tapered or whose upper surface is slanting.

With the configuration described above, punch-through resistance between the source diffusion layer SD and the drain diffusion layer DD is improved and the short channel effect can be suppressed. Moreover, since both side surface portions of the fin F is also used as the channel region, a high current driving capability can be achieved.

Further, a source region SR and a drain region DR are arranged over the source diffusion layer SD and the drain diffusion layer DD, respectively.

An interlayer insulation film (not shown) is arranged over the gate electrode GE, the source region SR, and the drain region DR. A plurality of plugs P1 is arranged in the interlayer insulating film. Among the plugs 1, a plug P1 arranged over a wide portion (gate pad) GP at the end of the gate electrode GE is designated as "P1G", a plug P1 arranged over the source region SR is designated as "P1S", and a plug P1 arranged over the drain region DR is designated as "P1D" (see FIG. 2).

Next, a description will be given to a planar shape (a shape in a plan view seen from the top) of each component of the semiconductor device of the present embodiment.

As shown in FIG. 2, the fin F has, in a plan view, a line-like shape (a rectangular shape having a long side in X-direction) with a specific width (a length in Y-direction, W1). Two fins F shown in FIG. 2 are arranged in parallel with a specific interval (pitch, D1) in between.

As shown in FIG. 2, the gate electrode GE has, in a plan view, a line-like shape (a rectangular shape having a long side in Y-direction) with a specific width (a length in X-direction, W2). Thus, the gate electrode GE extends in a direction intersecting the fin F. Further, at the end of the gate electrode GE, the wide portion (gate pad, width W3) GP larger than the width (W2) of the gate electrode GE is arranged.

The source diffusion layer SD and the drain diffusion layer DD are arranged in the fin F on both sides of the gate electrode GE. Also, the gate electrode GE is arranged over the fins F via the gate insulating film GI. More specifically, the gate insulating film GI is arranged over side surfaces and upper surfaces of the fins F (see FIG. 5).

As shown in FIG. 2, the source region SR has, in a plan view, a line-like shape (a rectangular shape having a long side in Y-direction) with a specific width (a length in X-direction, W4). Thus, the source region SR extends in a direction intersecting the fin F. Also, the drain region DR has, in a plan view, a line-like shape (a rectangular shape having a long side in Y-direction) with a specific width (a length in X-direction, W4). Thus, the drain region DR extends in the direction intersecting the fin F. To put it differently, the source region SR is so arranged as to extend in Y-direction over each of the source diffusion layers SD in the two fins F located on the other side (right side in FIG. 2) of the gate electrode GE. The drain region DR is so arranged as to extend in Y-direction over each of the drain diffusion layers DD in the two fins F located on one side (left side in FIG. 2) of the gate electrode GE. In FIG. 2, a distance between the gate electrode GE and the drain region DR is about the same as a distance between the gate electrode GE and the source region SR. However, the distance between the gate electrode GE and the drain region DR may be longer than the distance between the gate electrode GE and the source region SR.

As shown in FIG. 2, over the source region SR, two source plugs P1S are arranged. The two source plugs P1S are arranged over regions, respectively, in which the two fins F and the source region SR cross over (overlap). Further, over the drain region DR, one drain plug P1D is arranged. The drain plug P1D is arranged over a region where a region (trench region) located between the two fins F and the source region SR cross over. The number of the drain plugs P1D is smaller than the number of the source plugs P1S.

In this way, the drain plug P1D and the source plug P1S are so arranged as not to face each other. To put it differently, the drain plug P1D is so arranged as to correspond to a region between the two source plugs P1S. In other words, the drain plug P1D is arranged in a displaced manner so that its position in Y-direction may not overlap with either of the two source plugs P1S (alternate arrangement). The position in Y-direction refers to, for example, a y-coordinate of center coordinates (x, y) in a formation region of the drain plugs P1D or the source plugs P1S.

Thus, according to the present embodiment, the number of the drain plugs (plugs, contacts on the drain side) P1D and the number of the source plugs (plugs, contacts on the source side) P1S are so set as not to be at a ratio of 1 to 1. Also, the number of the drain plugs P1D is so set as to be smaller than the number of the source plugs P1S. Moreover, the drain plug P1D and the source plug P1S are so arranged as not to face each other.

According to such a configuration, a Miller effect-based circuit delay can be suppressed. Further, stability of circuit operation can be improved.

[Explanation of Manufacturing Method] Next, with reference to FIGS. 6 to 23, an explanation will be given to a manufacturing method of the semiconductor device of the present embodiment. Also, the configuration of the semiconductor device will be more clarified. FIGS. 6 to 23 are cross-sectional views showing manufacturing processes of the semiconductor device according to the present embodiment. Further, each of the cross-sectional views corresponds to, for example, a cross-section taken along line A1-A1, a cross-section taken along line A2-A2, or a cross-section taken along line B-B in a plan view of FIG. 2. Also, the following process is one example of the manufacturing processes of the semiconductor device of the present embodiment, and the semiconductor device of the present embodiment may be formed by other manufacturing processes.

Figure 6:
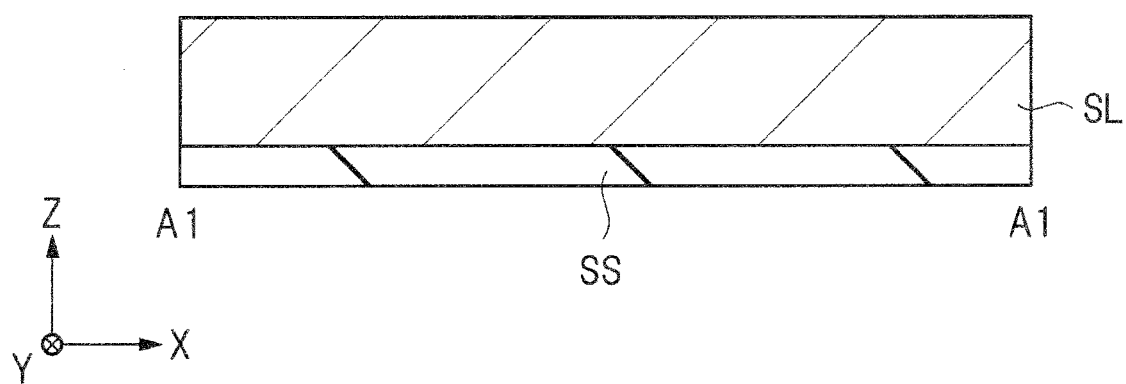
FIG. 6 is a cross-sectional view showing the process of manufacturing the semiconductor device of First Embodiment.
Figure 7:
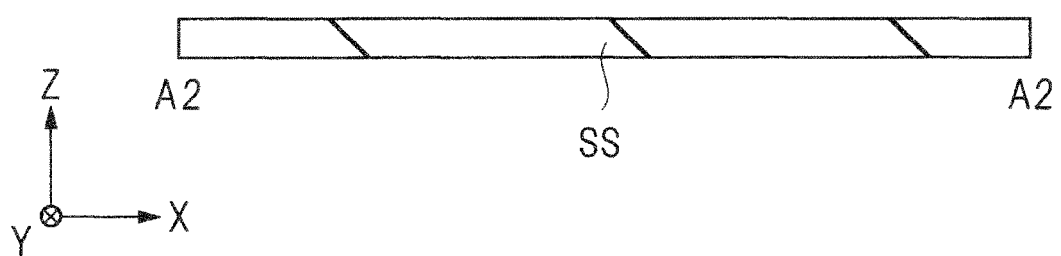
FIG. 7 is a cross-sectional view showing the process of manufacturing the semiconductor device of First Embodiment.
Figure 8:
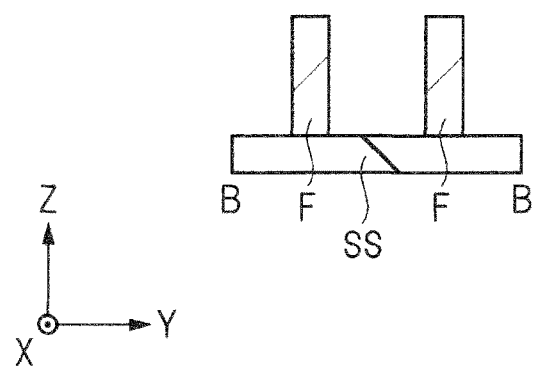
FIG. 8 is a cross-sectional view showing the process of manufacturing the semiconductor device of First Embodiment.

As shown in FIGS. 6 to 8, a supporting substrate (base material) SS where a semiconductor layer SL is formed is provided and a fin (convex portion) F is formed. The semiconductor layer SL is, for example, a silicon layer. For example, by forming photo-resist films (not shown) over the semiconductor layer SL and exposing them, a pattern containing a plurality of photo-resist films each having a line-like shape (a rectangular shape with a long side in X-direction) is formed. Subsequently, using the photo-resist films as masks, by etching the semiconductor layer SL, a plurality of fins F are formed.

Each of the fins F has a line-like shape (a rectangular shape having a long side in X-direction) with a specific width (a length in Y-direction, W1). The fins F are arranged at regular intervals (pitch, D1). To put it differently, the fin F has a rectangular parallelepiped shape, and side surfaces of the two adjacent fins F are spaced by a distance D1 (see FIG. 2). Further, there is formed a trench (concave portion) between the fins F (see FIG. 8). Also, the process described as above is called patterning. That is, the patterning is a process for obtaining desired layout patterns by processing a material in the under layer thereof through etching using, as a mask, a photo-resist film processed into a desired form by exposure and development, a hard mask film, or the like.

Figure 9:
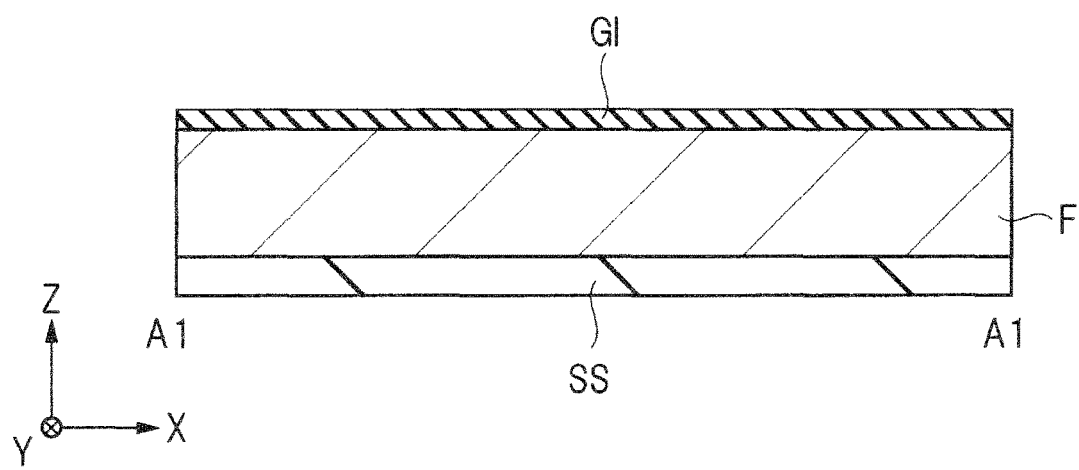
FIG. 9 is a cross-sectional view showing a process of manufacturing the semiconductor device of First Embodiment subsequent to FIG. 6.
Figure 10:
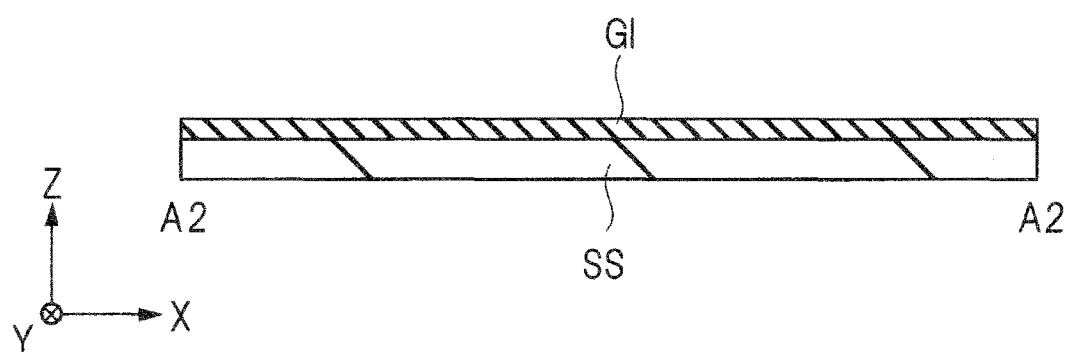
FIG. 10 is a cross-sectional view showing the process of manufacturing the semiconductor device of First Embodiment subsequent to FIG. 7.
Figure 11:
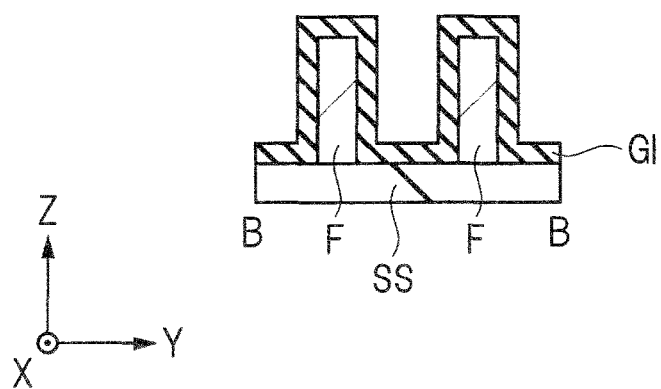
FIG. 11 is a cross-sectional view showing the process of manufacturing the semiconductor device of First Embodiment subsequent to FIG. 8.

Next, as shown in FIGS. 9 to 11, the gate insulating film GI containing an insulating film is formed over a surface of the fin F. For example, a silicon oxide film is formed over the surface of the fin F by a thermal-oxidation method. Further, a high dielectric constant film is laminated over the silicon oxide film by using a CVD method. Thus, the gate insulating film GI of a laminated film including the silicon oxide film and the high dielectric constant film can be formed. The gate insulating film GI is formed over side surfaces and upper surfaces of the fins F (see FIG. 11). In addition, a single layer of the film formed by the thermal-oxidation method may be used as the gate insulating film GI. Alternatively, a single layer of the film formed by the CVD method may be used as the gate insulating film GI.

Figure 12:
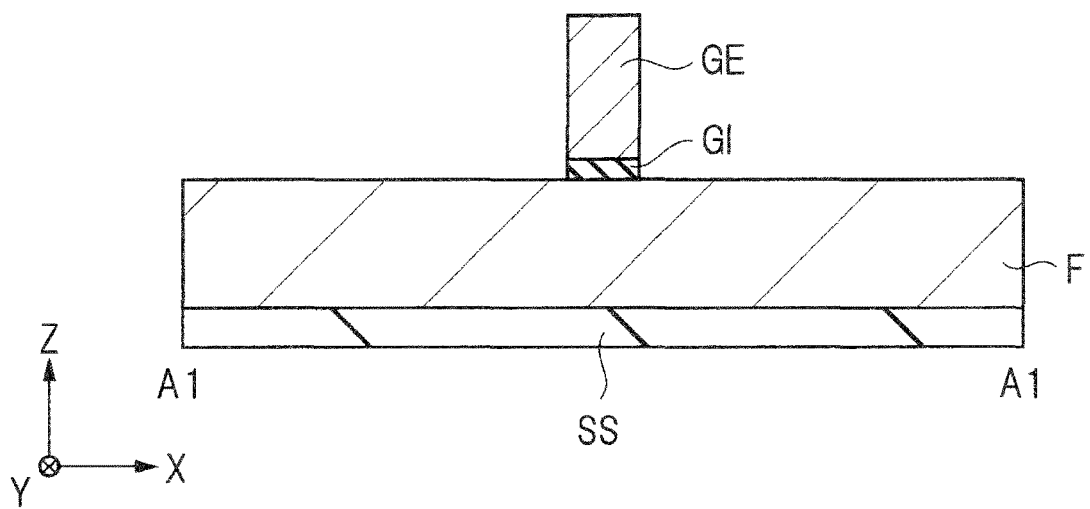
FIG. 12 is a cross-sectional view showing the process of manufacturing the semiconductor device of First Embodiment subsequent to FIG. 9.
Figure 13:
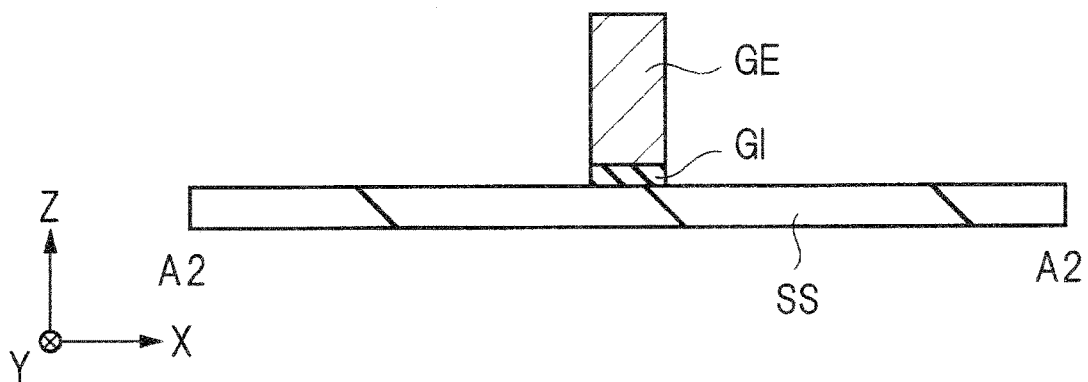
FIG. 13 is a cross-sectional view showing the process of manufacturing the semiconductor device of First Embodiment subsequent to FIG. 10.
Figure 14:
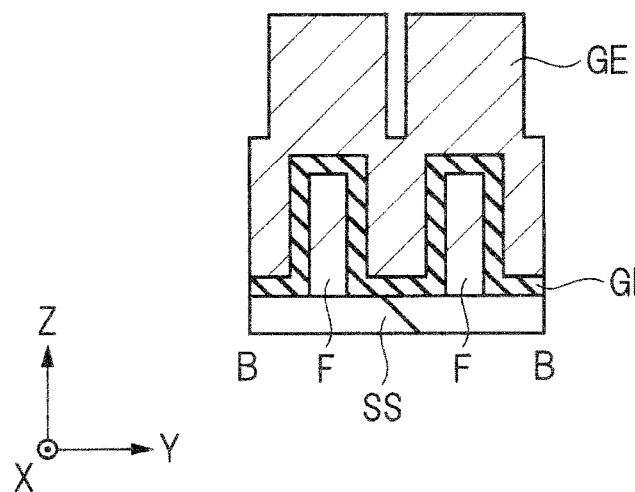
FIG. 14 is a cross-sectional view showing the process of manufacturing the semiconductor device of First Embodiment subsequent to FIG. 11.

Next, as shown in FIGS. 12 to 14, over the fin F, a gate electrode GE is formed via the gate insulating film GI. To put it differently, the gate electrode GE is so formed as to straddle the fins F. The gate electrode GE includes a conductive film.

The gate electrode GE is formed in a direction (Y direction, in this case) intersecting the fin F. The gate electrode GE has a line-like shape (a rectangular having a long side in Y-direction) with a specific width (a length in X-direction, W2). At the end portion of the gate electrode GE, the wide portion (gate pad, width W3) GP larger than the width W2 is formed (see FIG. 2).

For example, over the gate insulating film GI, as a gate electrode material, a polysilicon film is formed by using the CVD method etc. Subsequently, the gate electrode GE is formed by patterning the polysilicon film. In this regard, the gate insulating film GI exposing from both sides of the gate electrode GE may be removed.

Figure 15:
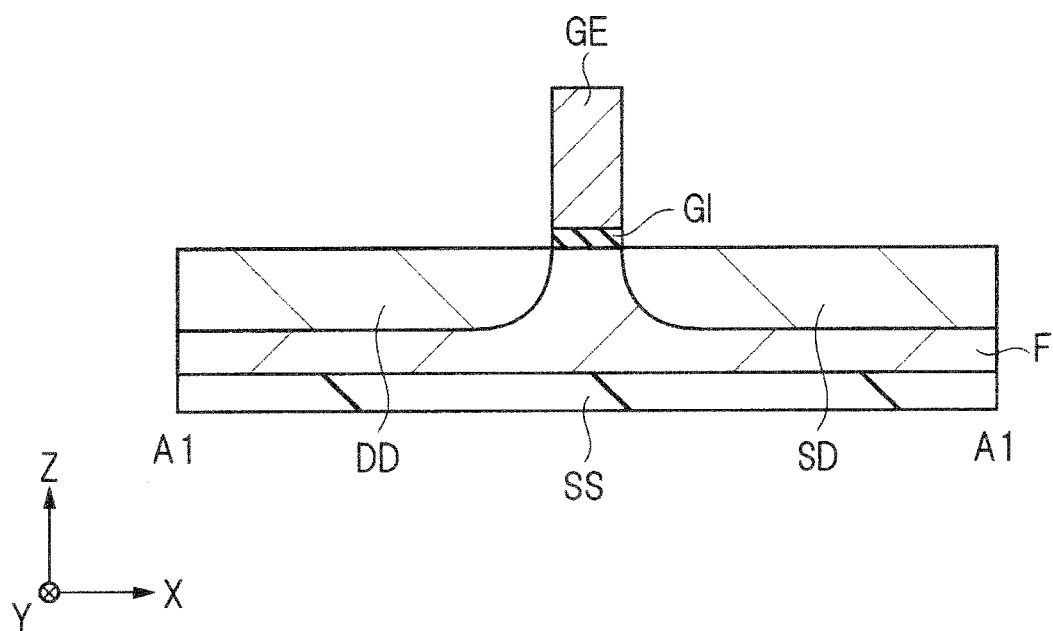
FIG. 15 is a cross-sectional view showing the process of manufacturing the semiconductor device of First Embodiment subsequent to FIG. 12.
Figure 16:
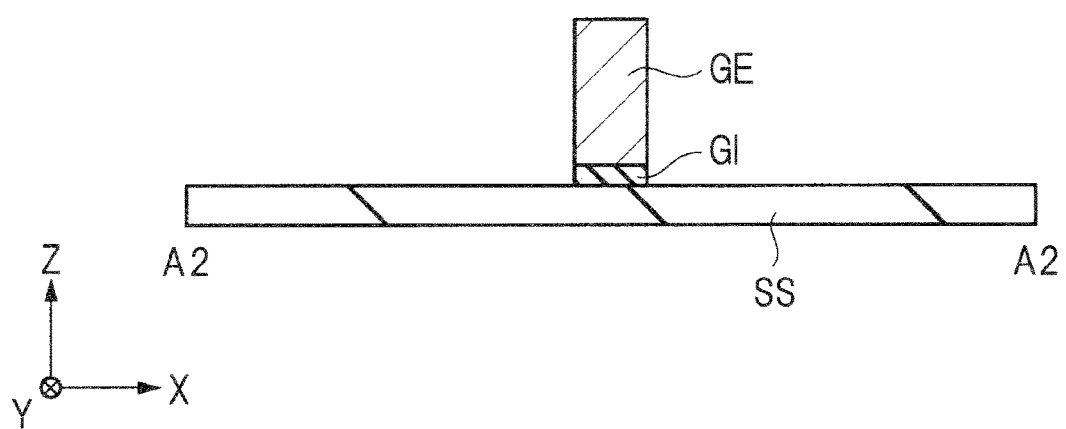
FIG. 16 is a cross-sectional view showing the process of manufacturing the semiconductor device of First Embodiment subsequent to FIG. 13.
Figure 17:
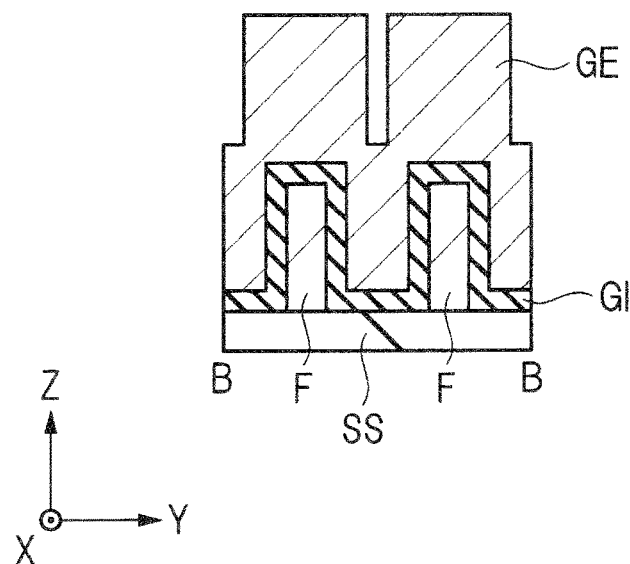
FIG. 17 is a cross-sectional view showing the process of manufacturing the semiconductor device of First Embodiment subsequent to FIG. 14.

Next, as shown in FIGS. 15 to 17, the source diffusion layer SD and the drain diffusion layer DD are formed in the fin F on both sides of the gate electrode GE. For example, using the gate electrode GE as a mask, an n-type impurity diffusion region (the source diffusion layer SD and the drain diffusion layer DD) is formed by ion implantation of the n-type impurity such as phosphorus (P) and arsenic (As). On this occasion, by using an oblique ion implantation method, the n-type impurity diffusion region can be formed accurately. For example, ion implantation of the n-type impurity is performed for the fin F obliquely from a first side surface of the fin F and, further, ion implantation of the n-type impurity is performed for the fin F obliquely from a second side surface (a surface opposed to the first side surface).

Further, for forming a p-channel type FINFET, it serves the purpose if ion implantation of a p-type impurity is performed. Also, the source diffusion layer SD and the drain diffusion layer DD may have a so-called LDD (Lightly Doped Drain) configuration. That is, the source diffusion layer SD and the drain diffusion layer DD may include a high concentration impurity region and a low concentration impurity region, respectively. In such a case, the high concentration impurity region is formed as follows. That is, first, a low concentration impurity region is formed by ion implantation using the gate electrode GE as a mask. Then, a sidewall film is formed over a side wall of the gate electrode GE. Finally, the high concentration impurity region is formed by ion implantation using the gate electrode GE and the sidewall film as masks. Further, a metal silicide film may be provided in an upper portion of the gate electrode GE, the source diffusion layer SD, and the drain diffusion layer DD. Still further, a cap insulating film may be provided in advance over the gate electrode GE.

Figure 18:
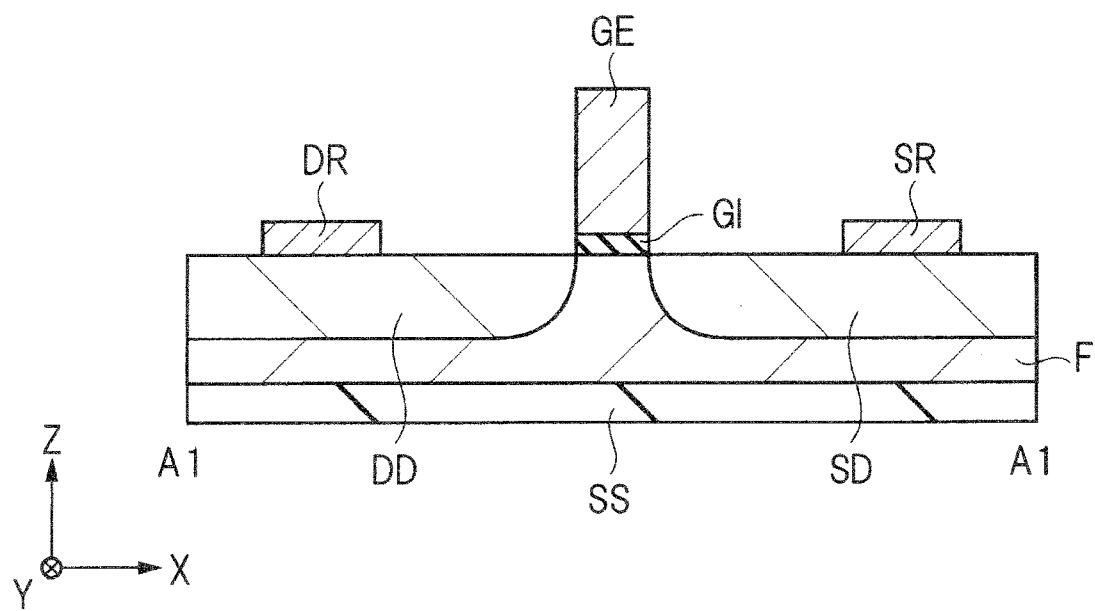
FIG. 18 is a cross-sectional view showing the process of manufacturing the semiconductor device of First Embodiment subsequent to FIG. 15.
Figure 19:
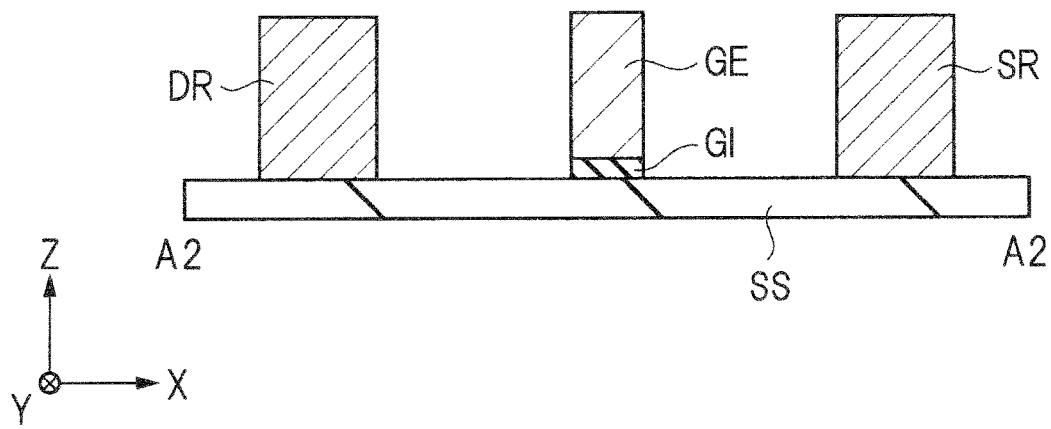
FIG. 19 is a cross-sectional view showing the process of manufacturing the semiconductor device of First Embodiment subsequent to FIG. 16.
Figure 20:
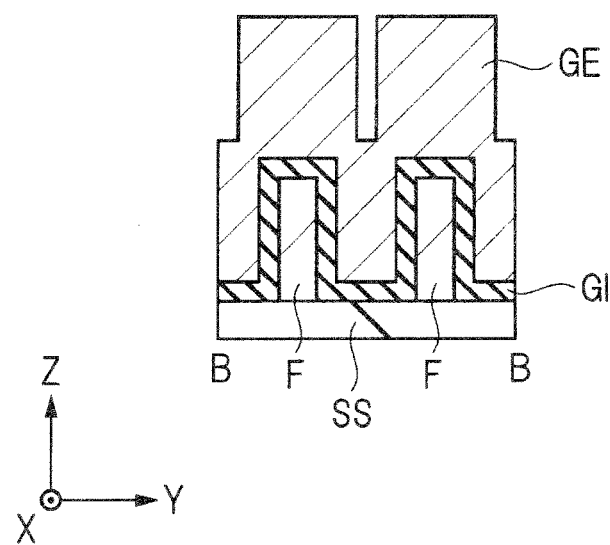
FIG. 20 is a cross-sectional view showing the process of manufacturing the semiconductor device of First Embodiment subsequent to FIG. 17.

Next, as shown in FIGS. 18 to 20, the source region SR and the drain region DR are formed over the fins F (the source diffusion layer SD and the drain diffusion layer DD). To put it differently, the source region SR and the drain region DR are so formed as to straddle the fins F (the source diffusing layer SD and the drain diffusion layer DD).

The source region SR and the drain region DR are formed in a direction (Y-direction, in this case) intersecting the fins F, respectively. Each of the source region SR and the drain region DR has a line-like shape (a rectangular shape having a long side in Y-direction) with a specific width (a length in X-direction, W4).

For example, over the fin F, as source region and drain region materials, conductive films (a semiconductor film, a metal film, a metal compound film, etc.) are formed using the CVD method etc. Next, as required, a surface of the conductive film is flattened by a CMP (Chemical Mechanical Polishing) method etc., or the etch-back treatment is given to the surface of the conductive film. Subsequently, the source region SR and the drain region DR are formed by patterning the conductive film.

Figure 21:
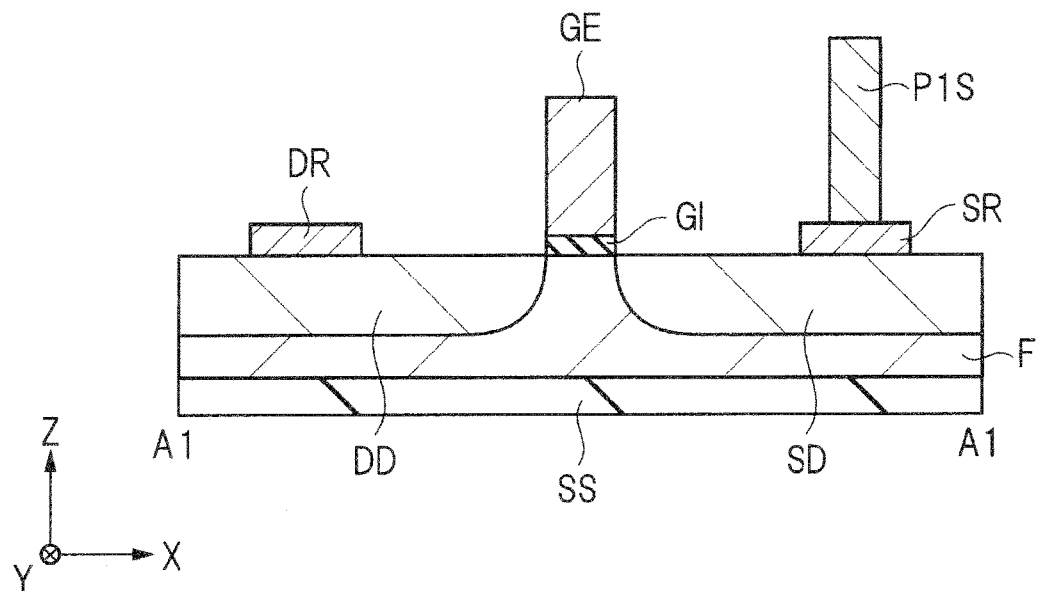
FIG. 21 is a cross-sectional view showing the process of manufacturing the semiconductor device of First Embodiment subsequent to FIG. 18.
Figure 22:
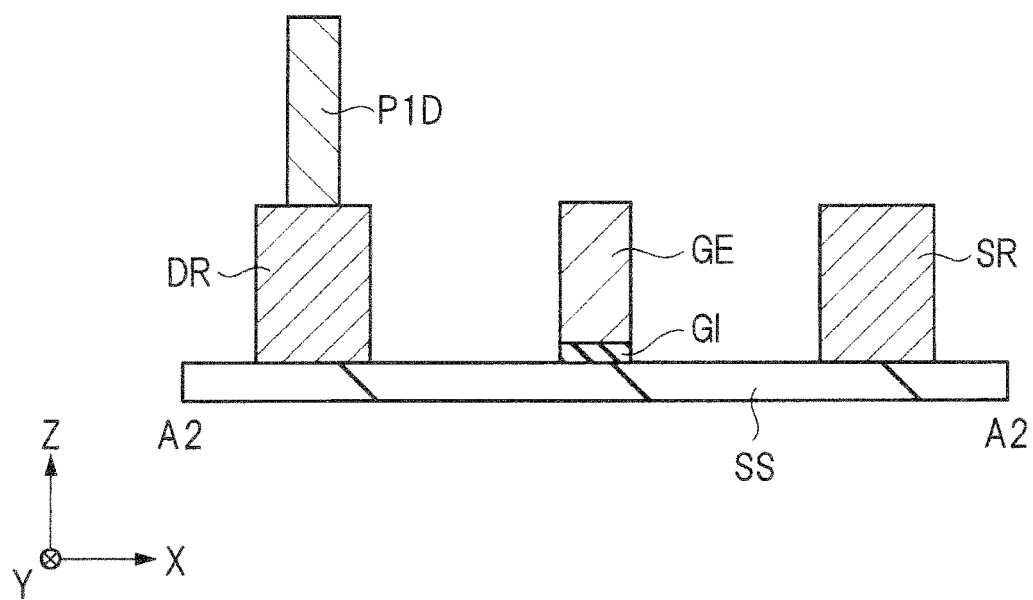
FIG. 22 is a cross-sectional view showing the process of manufacturing the semiconductor device of First Embodiment subsequent to FIG. 19.
Figure 23:
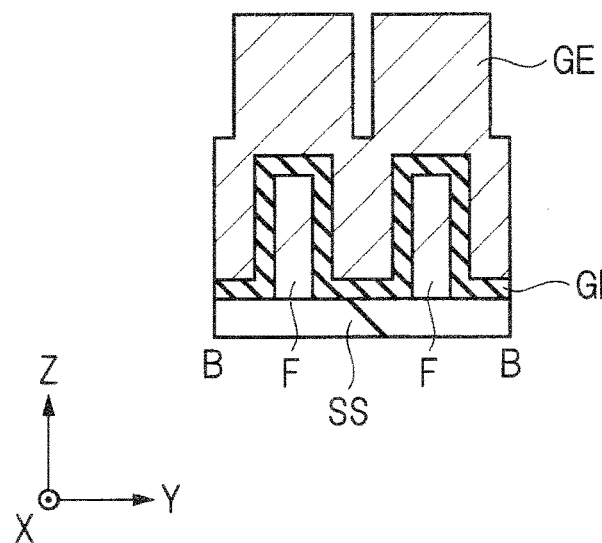
FIG. 23 is a cross-sectional view showing the process of manufacturing the semiconductor device of First Embodiment subsequent to FIG. 20.

Next, as shown in FIGS. 21 to 23, an interlayer insulating film (not shown) is formed above the supporting substrate SS. Further, in the interlayer insulating film, a drain plug P1D, a source plug P1S, and a gate plug (P1G, see FIG. 2) are formed.

For example, as the interlayer insulating film, a silicon oxide film is formed by the CVD method etc. over the fins F, between the fins F, and over the gate electrode GE, the source region SR, as well as the drain region DR. Also, in an under layer of the silicon oxide film, for example, an etch-stopper film containing a silicon nitride film may be formed. Subsequently, contact holes are formed by patterning the interlayer insulating film. That is, using a photo-resist film (not shown) as a mask, contact holes are formed by removing the interlayer insulating film located over a wide portion (gate pad GP, see FIG. 2), the source region SR, and the drain region DR.

On this occasion, a contact hole for the drain plug P1D and a contact hole for the source plug P1S are formed in a displaced manner so that their positions in Y-direction may not overlap, respectively.

Next, the plugs P1 (the drain plug P1D, the source plug P1S, and the gate plug P1G) are formed when the conductive film is buried inside the contact hole. For example, over the interlayer insulating film including the inside of the contact hole, for example, as a conductive film, metal films containing tungsten (W) etc. are laminated using a sputtering method. Subsequently, the unnecessary metal film outside the contact hole is removed by the CMP method, the etch-back method, etc.

Thus, two source plugs P1S are formed over the source region SR and one drain plug P1D is formed over the drain region DR.

As described above, the drain plug P1D and the source plug P1S are so arranged as not to face each other. To put it differently, the drain plug P1D is so arranged as to correspond to a region between two source plugs P1S. In other words, the drain plug P1D is arranged in a displaced manner so that its position in Y-direction may not overlap with either of the two source plugs P1S (see FIG. 2).

Next, a wiring (not shown) is formed over the plug P1 and the interlayer insulating film. After that, a multilayer wiring may be formed by repeating the formation of the interlayer insulating film, the plug, and the wiring. The wiring may be formed by patterning the conductive film. Alternatively, the wiring may be formed by a so-called damascene method. According to the damascene method, a wiring trench is formed in the insulating film, and the wiring is formed when the conductive film is buried inside the wiring trench.

With the processes described above, the semiconductor device of the present embodiment can be formed.

Thus, according to the present embodiment, the number of the drain plugs P1D and the number of the source plugs P1S are so set as not to be at a ratio of 1 to 1. Also, the number of the drain plugs P1D is so set as to be smaller than the number of the source plugs P1S. Furthermore, the drain plug P1D and the source plug P1S are so arranged as not to face each other.

According to such a configuration, of the gate-drain capacitance (parasitic capacitance on the drain side), i.e., capacitance between the gate electrode GE and the drain diffusion layer DD, capacitance between the gate electrode GE and the drain region DR, and capacitance between the gate electrode GE and the drain plug P1D, the capacitance between the gate electrode GE and the drain plug P1D can be reduced. Therefore, the gate-drain capacitance can be made smaller than the gate-source capacitance (the capacitance between the gate electrode GE and the source diffusion layer SD, the capacity between the gate electrode GE and the source region SR, and the capacitance between the gate electrode GE and the source plug P1S) (see FIGS. 3 and 4).

Thus, by making the gate-drain capacitance smaller than the gate-source capacitance, the Miller effect-based circuit delay can be suppressed and an operation speed of the semiconductor element can be raised. In this regard, the Miller effect refers to a phenomenon in which the capacitance of a capacitor coupled between the input and the output of an amplifier such as a FET appears to be greater than a real value. Further, according to the above configuration, the capacitance on the source side increases more than the capacitance on the drain side, and the resistance on the drain side relatively rises, improving the stability of circuit operation. In this regard, when patterning the fins F, a double patterning method may be used. For example, with use of different photo masks, by independently transferring two adjacent fins F to photo-resist films, exposing them, and developing them, the processing accuracy of the photo-resist films can be improved. As a result, variation in processing of the fins F is suppressed and the pattern of the fins F can be formed accurately. In particular, even when fine fins are arranged with a narrow pitch, the pattern of the fins F can be formed accurately.

<Application Example 1> The two fins F are used in the above semiconductor device (FIGS. 1 to 5). However, two or more fins F may be used.

Figure 24:
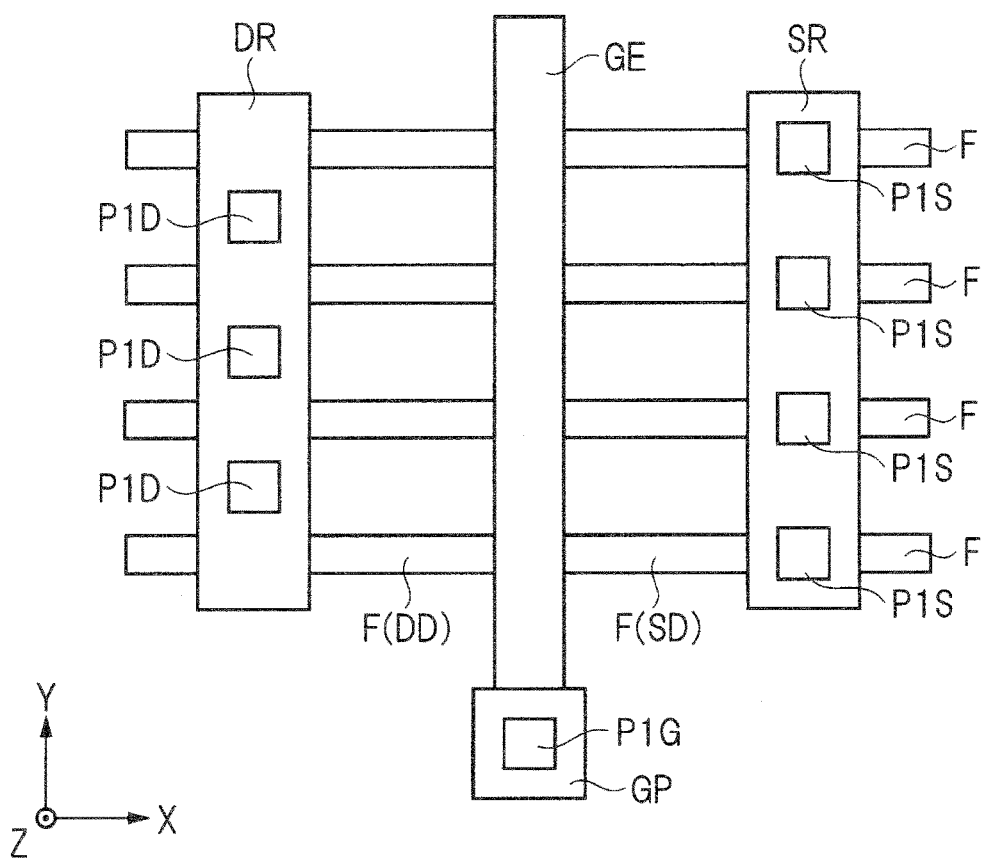
FIG. 24 is a plan view showing a configuration of a semiconductor device of Application Example 1 of First Embodiment.

FIG. 24 is a plan view showing a configuration of a semiconductor device of Application Example 1 of the present embodiment. Also, the configuration of the semiconductor device of Application Example 1 is similar to that of the above semiconductor device (FIGS. 1 to 5) except for the number of fins F. Therefore, the detailed explanation thereof will be omitted.

As shown in FIG. 24, the fin F has, in a plan view, a line-like shape (a rectangular shape having a long side in X-direction) with a specific width (a length in Y-direction). Four fins F are arranged at regular intervals (pitch).

As shown in FIG. 24, the gate electrode GE has, in a plan view, a line-like shape (a rectangular shape having a long side in Y-direction) with a specific width (a length in X-direction). Thus, the gate electrode GE extends in the direction intersecting the fin F. Moreover, at the end of the gate electrode GE, the wide portion (gate pad) GP larger than the width of the gate electrode GE is arranged.

The source diffusion layer SD and the drain diffusion layer DD are arranged in the fin F on both sides of the gate electrode GE. Also, the gate electrode GE is arranged over the fin F via the gate insulating film GI.

As shown in FIG. 24, the source region SR has, in a plan view, a line-like shape (a rectangular shape having a long side in Y-direction) with a specific width (a length in X-direction). Thus, the source region SR extends over the four fins F in the direction intersecting the fins F. Moreover, the drain region DR has, in a plan view, a line-like shape (a rectangular shape having a long side in Y-direction) with a specific width (a length in Y-direction). Thus, the drain region DR extends over the four fins F in the direction intersecting the fins F.

And as shown in FIG. 24, four source plugs P1S are arranged over the source region SR which extends over the four fins F in the direction intersecting the fins F. The four source plugs P1S are arranged over regions, respectively, in which the four fins F and the source region SR cross over. Also, over the drain region DR which extends over the four fins in the direction intersecting the fins F, three drain plugs P1D are arranged. These three drain plugs P1D are arranged over regions, respectively, in which the three line-like regions each located between respective fins among the four fins F and the source region SR cross over. The number of the drain plugs P1D is smaller than the number of the source plugs P1S.

Thus, in Application Example 1 also, the drain plug P1D and the source plug P1S are so arranged as not to face each other. To put it differently, the drain plug P1D is so arranged as to correspond to the region between the two source plugs P1S. In other words, the three drain plugs P1D are arranged in a displaced manner so that each of their positions in Y-direction may not overlap with any of the four source plugs P1S.

Thus, according to the present embodiment, the number of the drain plugs P1D and the number of the source plugs P1S are so set as not to be at a ratio of 1 to 1. Also, the number of the drain plugs P1D is so set as to be smaller than the number of the source plugs P1S. Furthermore, the drain plug P1D and the source plug P1S are so arranged as not to face each other.

With such a configuration also, as in the case of the semiconductor device shown in FIGS. 1 to 5, the Miller effect-based circuit delay can be suppressed. Moreover, stability of circuit operation can be improved.

Further, the semiconductor device of the present application example can be formed through processes similar to those of the semiconductor device shown in FIGS. 1 to 5. In this regard, when patterning four or more fins F, the double patterning method may be used. For example, among the four fins F, a first fin and a third fin from the top are paired, and a second fin and a fourth fin from the top are paired. Then, by transferring those pairs independently to photo-resist films using different photo masks, exposing them, and developing them, the processing accuracy of the photo-resist films can be improved. As a result, variation in processing of the fins F can be suppressed and the pattern of the fins F can be formed accurately. In particular, even when fine fins are arranged at a narrow pitch, the pattern of the fins F can be formed accurately.

<Application Example 2> In the semiconductor device (FIG. 24) of Application Example 1, over the four fins F, the drain region DR extending in the direction intersecting the fins F is provided. However, the drain region DR may be divided.

Figure 25:
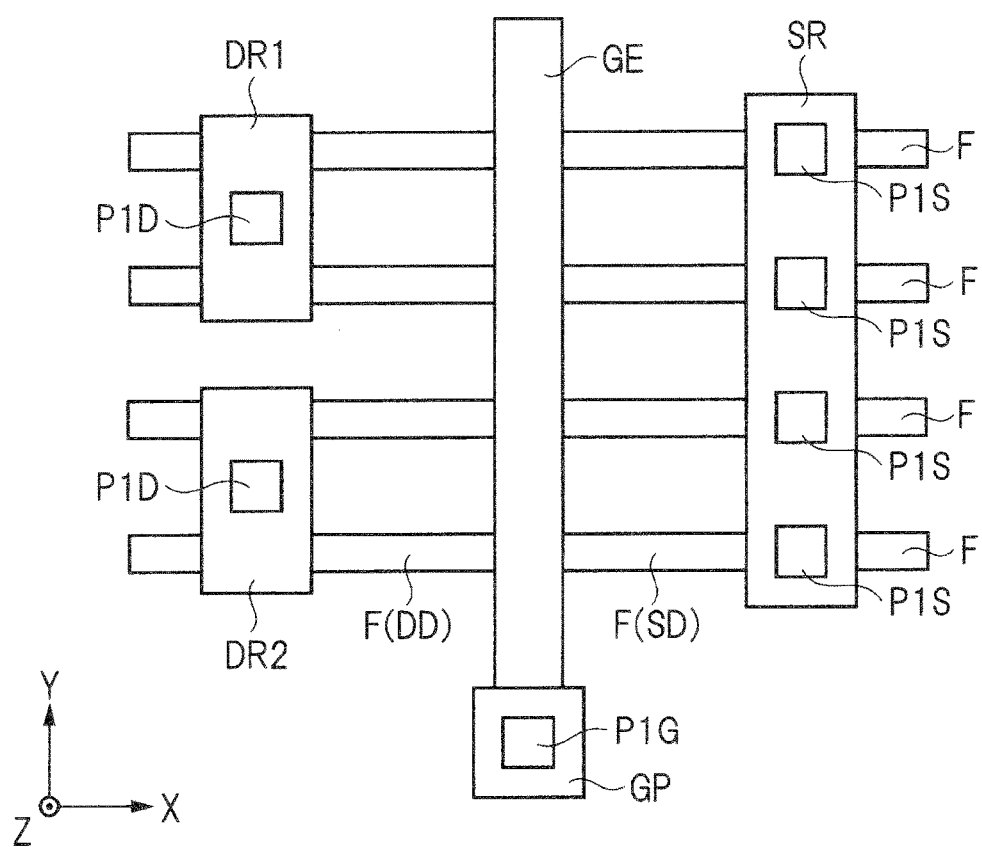
FIG. 25 is a plan view showing a configuration of a semiconductor device of Application Example 2 of First Embodiment.

FIG. 25 is a plan view showing a configuration of a semiconductor device of Application Example 2 of the present embodiment. Also, the configuration of the semiconductor device of Application Example 2 is similar to that of the semiconductor device (FIG. 24) of Application Example 1 except for a shape of the drain region DR. Therefore, the shape of the drain region DR will be explained in detail.

As shown in FIG. 25, there are arranged four source plugs P1S over the source region SR extending, over the four fins F, in the direction intersecting the fins F. The four source plugs P1S are arranged over regions, respectively, in which the four fins F and the source region SR cross over.

In this regard, as for the drain region (DR), in Application Example 2, there are provided: a drain region (drain part) DR1 extending, over two fins F of the four fins F, in the direction intersecting the fins F; and a drain region (drain part) DR2 extending, over the other two fins F, in the direction intersecting the fins. Thus, by arranging the drain regions (DR1, DR2) in a divided manner, the gate-drain capacitance can be further reduced. For example, capacitance corresponding to a region between two drain plugs P1D as well as the drain regions can be reduced.

The semiconductor device of Application Example 2 can be formed through processes similar to those of the semiconductor device shown in FIGS. 1 to 5. In this regard also, the fins may be formed by using the double patterning method.

(Second Embodiment) In the semiconductor device (FIGS. 1 to 5) of First Embodiment, the two source plugs P1S are provided. That is, the source plugs P1S are provided over the regions, respectively, in which the two fins F and the source region SR cross over. However, a long source plug P1SL in the shape of two source plugs P1S jointed together may be provided.

Figure 26:
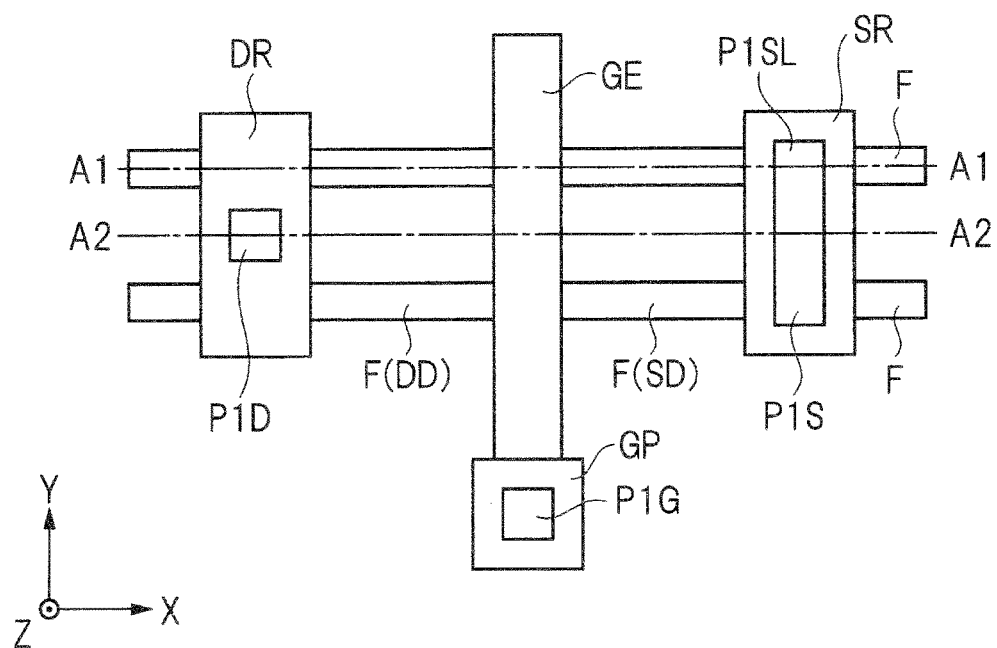
FIG. 26 is a plan view showing a configuration of a semiconductor device of Second Embodiment.
Figure 27:
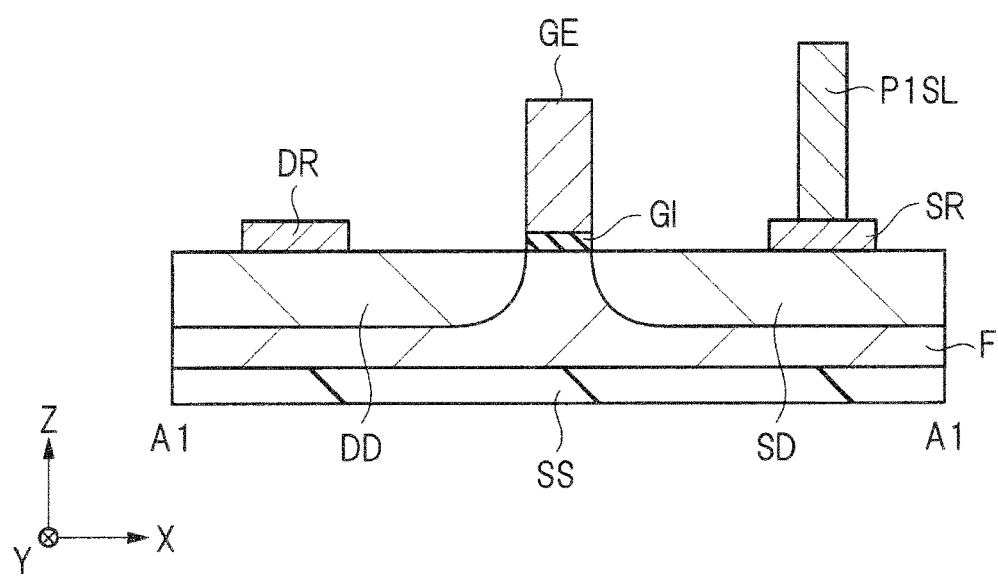
FIG. 27 is a cross-sectional view showing a configuration of a semiconductor device of Second Embodiment.
Figure 28:
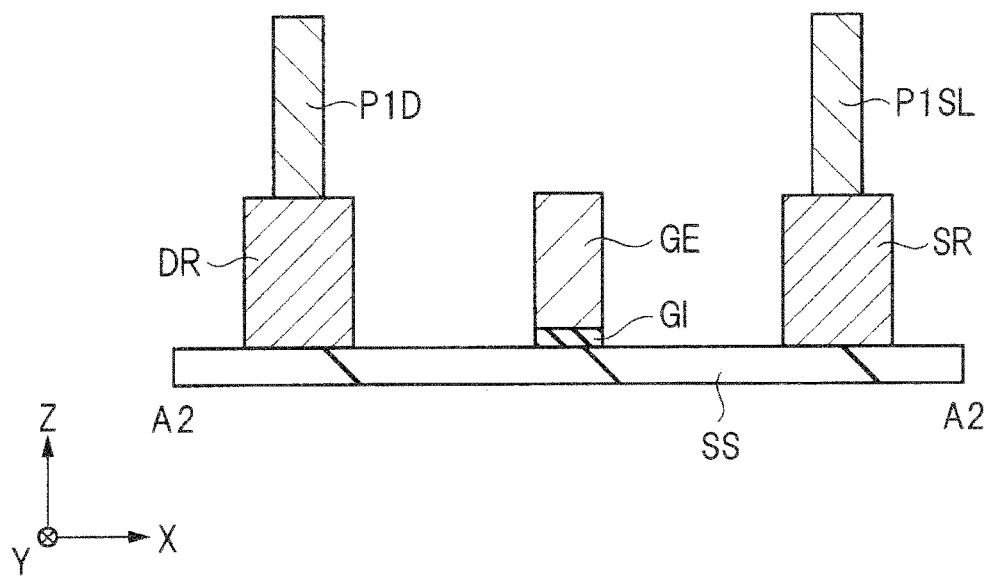
FIG. 28 is a cross-sectional view showing the configuration of the semiconductor device of Second Embodiment.

FIG. 26 is a plan view showing a configuration of a semiconductor device of the present embodiment. FIGS. 27 and 28 are cross-sectional views showing the configuration of the semiconductor device of the present embodiment. The cross-sectional view of FIG. 27 corresponds, for example, to a cross-section taken along line A1-A1 in a plan view of FIG. 26, and the cross-sectional view of FIG. 28 corresponds, for example, to a cross-section taken along line A2-A2 in a plan view of FIG. 26.

The configuration of the semiconductor device of the present embodiment is similar to that of the semiconductor device (FIGS. 1 to 5) of First Embodiment except for a shape of the source plug P1SL. Therefore, the shape of the source plug P1SL will be described in detail.

As shown in FIG. 26, one source plug P1SL is arranged over the source region SR extending, over the two fins F, in a direction intersecting the fins F. The source plug P1SL is so arranged as to join regions in which the two fins F and the source region SR cross over, respectively. The source plug P1SL has a rectangular shape having a long side in Y-direction. A length (width) of aside (short side) of the source plug P1SL in X-direction is about the same as a length of a side of the drain plug P1D in X-direction. However, a length of the side (long side) of the source plug P1SL in Y-direction is longer than a length of a side of the drain plug P1D in Y-direction. Therefore, a facing area of the source plug P1SL and the gate electrode GE becomes larger than a facing area of the drain plug P1D and the gate electrode GE. In other words, a line segment (facing region) in Y-direction where the source plug P1SL and the gate electrode GE overlap becomes larger than a line segment (facing region) in Y-direction where the drain plug P1D and the gate electrode GE overlap.

According to such a configuration, of the gate-source capacitance, i.e., capacitance between the gate electrode GE and the source diffusion layer SD, capacitance between the gate electrode GE and the source region SR, and capacitance between the gate electrode GE and the source plug P1 SL, the capacitance between the gate electrode GE and the source plug P1SL becomes larger than that of the semiconductor device (FIGS. 1 to 5) of First Embodiment (see also FIG. 27 and FIG. 28). As a result, stability of circuit operation can be improved.

In addition, the semiconductor device of the present embodiment can be formed through processes similar to those of the semiconductor device of First Embodiment.

<Application Example> In the above semiconductor device (FIG. 26), the two fins F are used. However, as explained in Application Examples 1 and 2 of First Embodiment, two or more fins F may be used.

Figure 29:
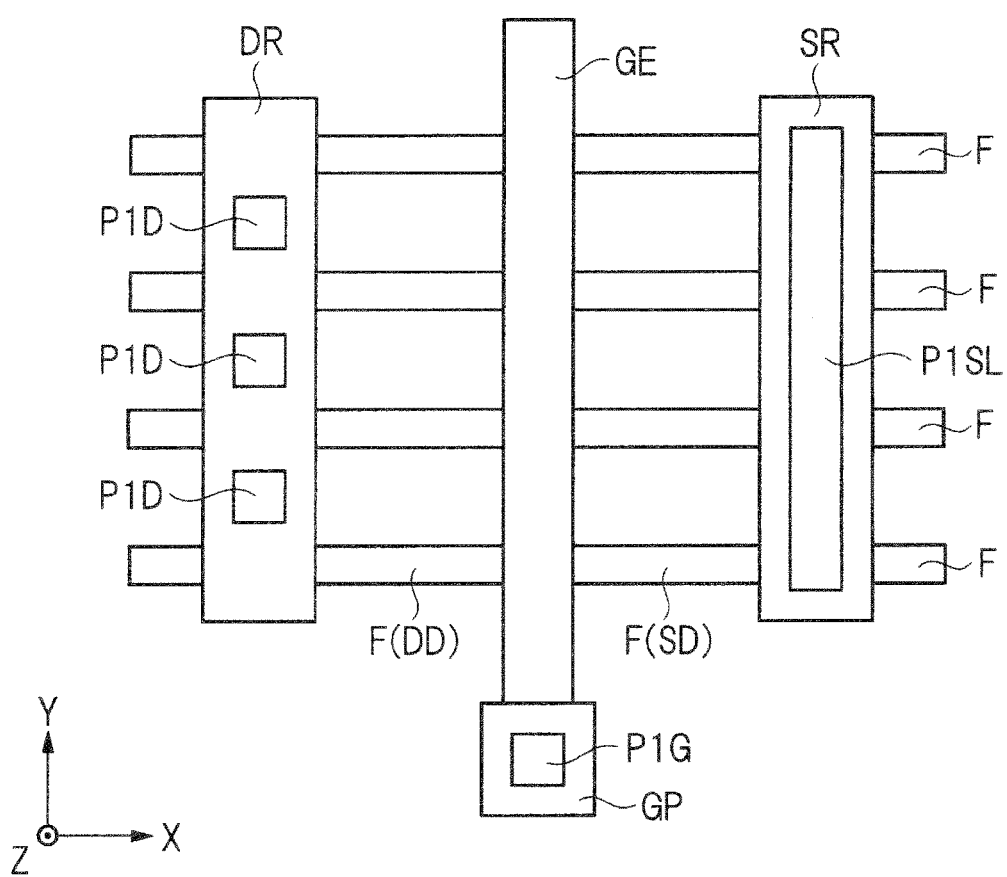
FIG. 29 is a plan view showing a configuration of a semiconductor device of Application Example 1 of Second Embodiment.

FIG. 29 is a plan view showing a configuration of a semiconductor device of Application Example of the present embodiment. Further, the detailed explanation of the same configuration as that of the above semiconductor device (FIG. 26) will be omitted.

As shown in FIG. 29, the fin F has, in a plan view, a line-like shape (a rectangular shape having a long side in X-direction) with a specific width (a length in Y-direction). The four fins F are arranged in parallel to one another at regular intervals (pitch).

As shown in FIG. 29, the gate electrode GE has, in a plan view, a line-like shape (a rectangular shape having a long side in Y-direction) with a specific width (a length in X-direction). Thus, the gate electrode GE extends in the direction intersecting the fins F. Moreover, at the end of the gate electrode GE, the wide portion (gate pad) GP larger than the width of the gate electrode GE is arranged.

The source diffusion layer SD and the drain diffusion layer DD are arranged in the fin F on both sides of the gate electrode GE. Also, the gate electrode GE is arranged over the fin F via the gate insulating film GI.

As shown in FIG. 29, the source region SR has, in a plan view, a line-like shape (a rectangular shape having a long side in Y-direction) with a specific width (a length in X-direction). Thus, the source region SR extends, over the four fins F, in the direction intersecting the fins F. Moreover, the drain region DR has, in a plan view, a line-like shape (a rectangular shape having a long side in Y-direction) with a specific width (a length in X-direction). Thus, the drain region DR extends over the four fins F in the direction intersecting the fins F.

As shown in FIG. 29, one source plug P1SL is arranged over the source region SR extending, over the four fins F, in a direction intersecting the fins F. The source plug P1SL is so arranged as to join regions in which outermost fins F (an uppermost fin F and a lowermost fin F in FIG. 29) of the four fins F and the source region SR cross over, respectively. The source plug P1SL has a rectangular shape having a long side in Y-direction. A length (width) of a side (short side) of the source plug P1SL in X-direction is about the same as a length of a side of the drain plug P1D in X-direction. However, a length of the side (long side) of the source plug P1SL in Y-direction is longer than a length of a side of the drain plug P1D in Y-direction.

Three drain plugs P1D are arranged over the drain region DR extending, over the four fins F, in the direction intersecting the fins F. The three drain plugs P1D are arranged over regions, respectively, in which three line-like regions each located between respective fins among the four fins F and the source regions SR cross over. The formation region of the drain plugs P1D (sum of the formation regions of the three drain plugs P1D) is smaller than the formation region of the source plug P1SL. Further, a facing area of the source plug P1SL and the gate electrode GE is larger than a facing area of the three drain plugs P1D and the gate electrode GE.

According to such a configuration, of the gate-source capacitance, i.e., capacitance between the gate electrode GE and the source diffusion layer SD, capacitance between the gate electrode GE and the source region SR, and capacitance between the gate electrode GE and the source plug P1 SL, the capacitance between the gate electrode GE and the source plug P1SL becomes larger than that of the semiconductor device (FIG. 24) of Application Example 1 of First Embodiment. As a result, stability of circuit operation can be improved.

Figure 30:
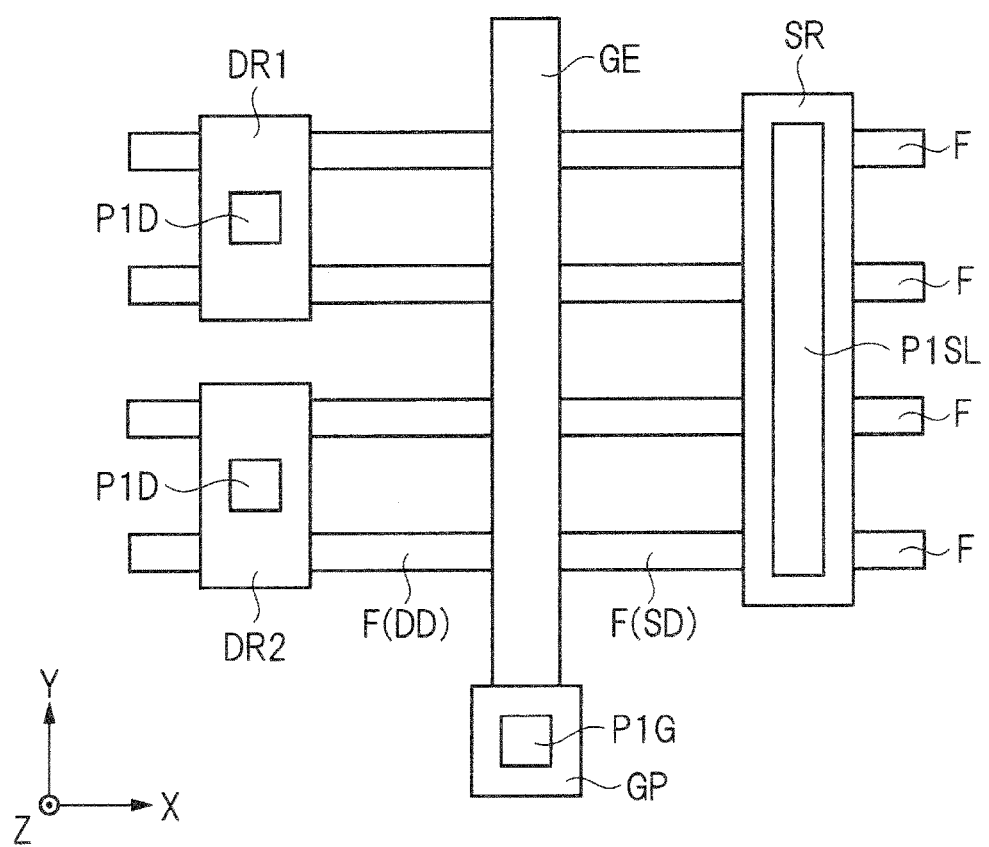
FIG. 30 is a plan view showing a configuration of a semiconductor device of Application Example 2 of Second Embodiment.

FIG. 30 is a plan view showing a configuration of a semiconductor device of Application Example 2 of the present embodiment. Also, the configuration of the semiconductor device of Application Example 2 is similar to that of the semiconductor device (FIG. 29) of Application Example 1 except for a shape of the drain region DR. Therefore, the shape of the drain region DR will be explained in detail.

As shown in FIG. 30, according to Application Example 2, the drain region (DR) is provided in a divided manner. Specifically, there are provided: a drain region DR1 extending, over two fins of the four fins F, in the direction intersecting the fins F; and a drain region DR2 extending, over the other two fins F, in the direction intersecting the fins F. Thus, by arranging the drain region (DR1, DR2) in a divided manner, the gate-drain capacitance can be further reduced.

Moreover, the semiconductor device of the present application example can be formed through processes similar to those of the semiconductor device of First Embodiment. In this case also, the fins may be formed by using the double patterning method.

(Third Embodiment) According to the present embodiment, a height of the fin F on the drain side is made lower than a height of the fin F on the source side.

Figure 31:
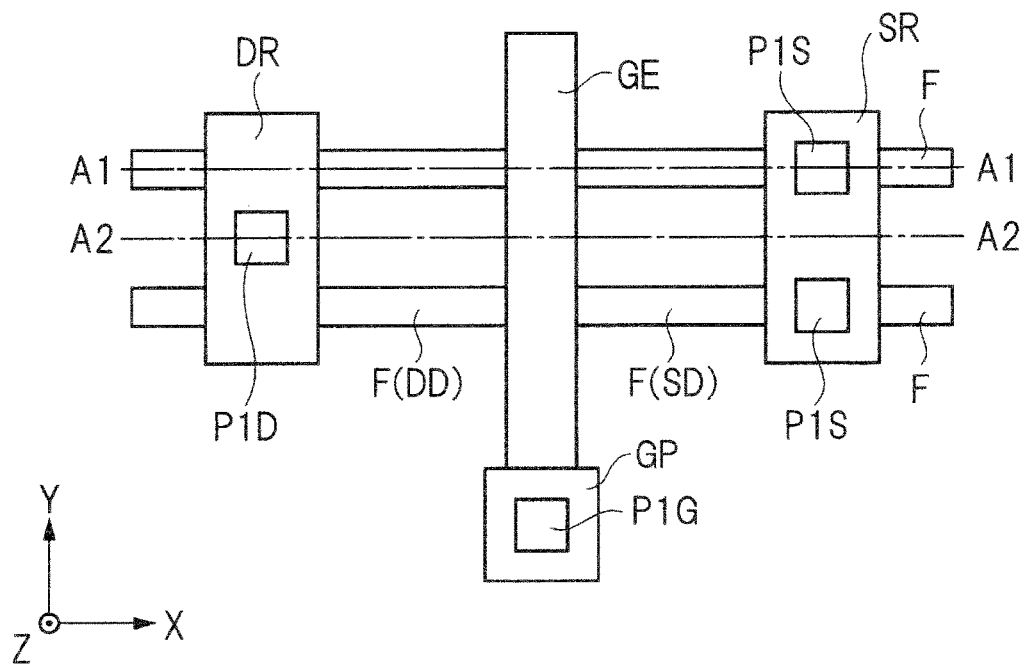
FIG. 31 is a plan view showing a configuration of a semiconductor device of Third Embodiment.
Figure 32:
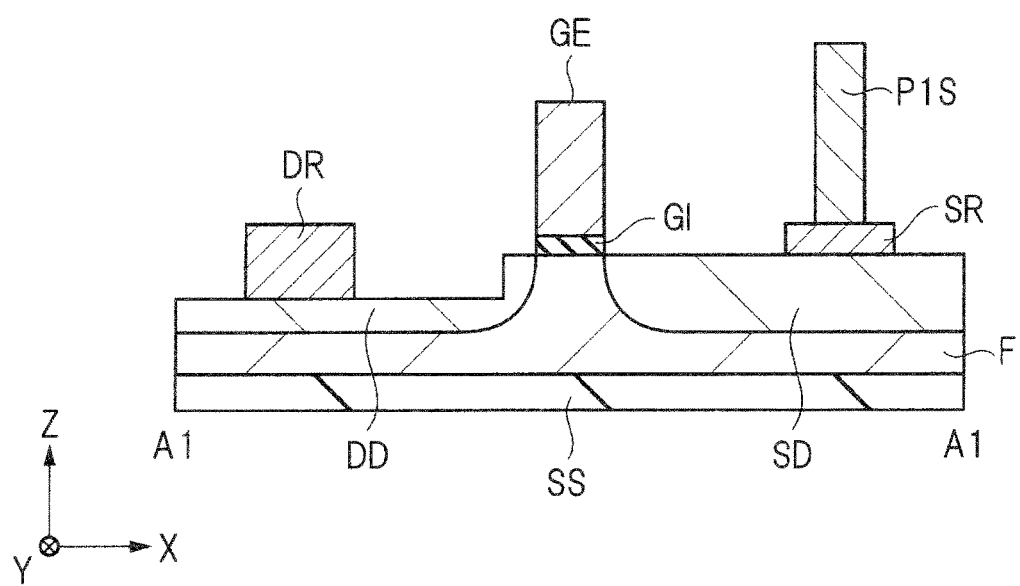
FIG. 32 is a cross-sectional view showing the configuration of the semiconductor device of Third Embodiment.
Figure 33:
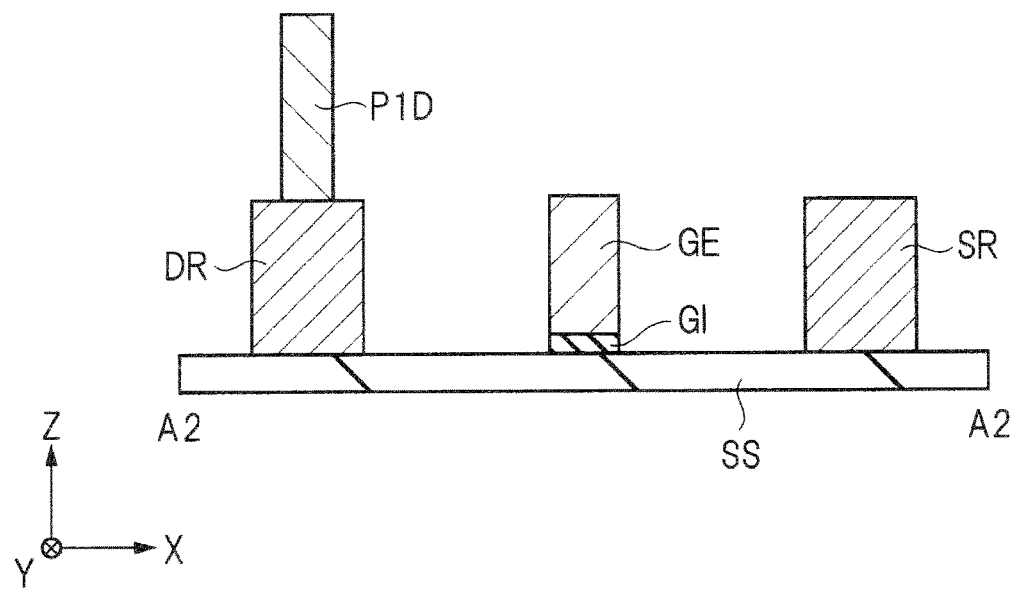
FIG. 33 is a cross-sectional view showing the configuration of the semiconductor device of Third Embodiment.

FIG. 31 is a plan view showing a configuration of a semiconductor device of the present embodiment. FIGS. 32 and 33 are cross-sectional views showing the configuration of the semiconductor device of the present embodiment. The cross-sectional view of FIG. 32 corresponds, for example, to a cross-section taken along line A1-A1 in the plan view of FIG. 31, and the cross-sectional view of FIG. 33 corresponds, for example, to a cross-section taken along line A2-A2 in the plan view of FIG. 31.

The configuration of the semiconductor device of the present embodiment is similar to that of the semiconductor device (FIGS. 1 to 5) of First Embodiment except for a height of the fin F on the drain side. Therefore, the shape of the fin F will be explained in detail.

The plan view of the present embodiment is similar to the plan view of First Embodiment. That is, as shown in FIG. 31, the gate electrode GE extending, over the two fins F, in the direction intersecting the fins F is provided. Over the source diffusion layer SD on one side of the gate electrode GE, the source region SR extending in the direction intersecting the fins F is provided. Over the drain diffusion layer DD on the other side of the gate electrode GE, the drain region DR extending in the direction intersecting the fins F is provided.

Over the source region SR, two source plugs P1S are arranged. The two source plugs P1S are arranged over regions, respectively, in which the two fins F and the source region SR cross over. Also, over the drain region DR, one drain plug P1D is arranged. The drain plug P1D is arranged over regions in which a region between the two fins F and the source region SR cross over. The number of the drain plugs P1D is smaller than the number of the source plugs P1S.

In this way, the drain plug P1D and the source plug P1S are so arranged as not to face each other. To put it differently, the drain plug P1D is so arranged as to correspond to the region between the two source plugs P1S. In other words, the drain plug P1D is arranged in a displaced manner so that its position in Y-direction may not overlap with either of the two source plugs P1S.

Thus, according to the present embodiment, the number of the drain plugs (plugs, contacts on the drain side) P1D and the number of the source plugs (plugs, contacts on the source side) P1S are so set as not to be at a ratio of 1 to 1 and, also, the number of the drain plugs P1D is so set as to be smaller than the number of the source plugs P1S. Furthermore, the drain plug P1D and the source plug P1S are so arranged as not to face each other.

According to such a configuration, as in First Embodiment, the Miller effect-based circuit delay can be suppressed. Also, stability of circuit operation can be improved.

Further, in the present embodiment, as shown in FIG. 32, the height of the fin F on the drain side is lower than the height of the fin F on the source side. According to such a configuration, of the gate-drain capacitance, i.e., capacitance between the gate electrode GE and the drain diffusion layer DD, capacitance between the gate electrode GE and the drain region DR, and capacitance between the gate electrode GE and the drain plug P1D, the capacitance between the gate electrode GE and the drain diffusion layer DD can be reduced. Therefore, the gate-drain capacitance can be smaller than the gate-source capacitance (the capacitance between the gate electrode GE and the source diffusion layer SD, the capacitance between the gate electrode GE and the source region SR, and the capacitance between the gate electrode GE and the source plug P1S). As a result, the Miller effect-based circuit delay can be further suppressed and stability of circuit operation can be further improved.

The semiconductor device of the present embodiment can be formed through processes similar to those of the semiconductor device of First Embodiment. However, according to the present embodiment, after formation of the fins F each having a rectangular parallelepiped shape, by etching an upper portion of the fin F on the drain region DR side, the height of the fin F on the drain side is made lower than the height of the fin F on the source side.

(Fourth Embodiment) In the semiconductor device (FIGS. 31 to 33) of Third Embodiment, the two source plugs P1S are provided. That is, the source plugs P1S are provided over regions, respectively, in which the two fins F and the source region SR cross over. However, a long source plug P1SL in the shape of two source plugs P1S joined together may be provided.

Figure 34:
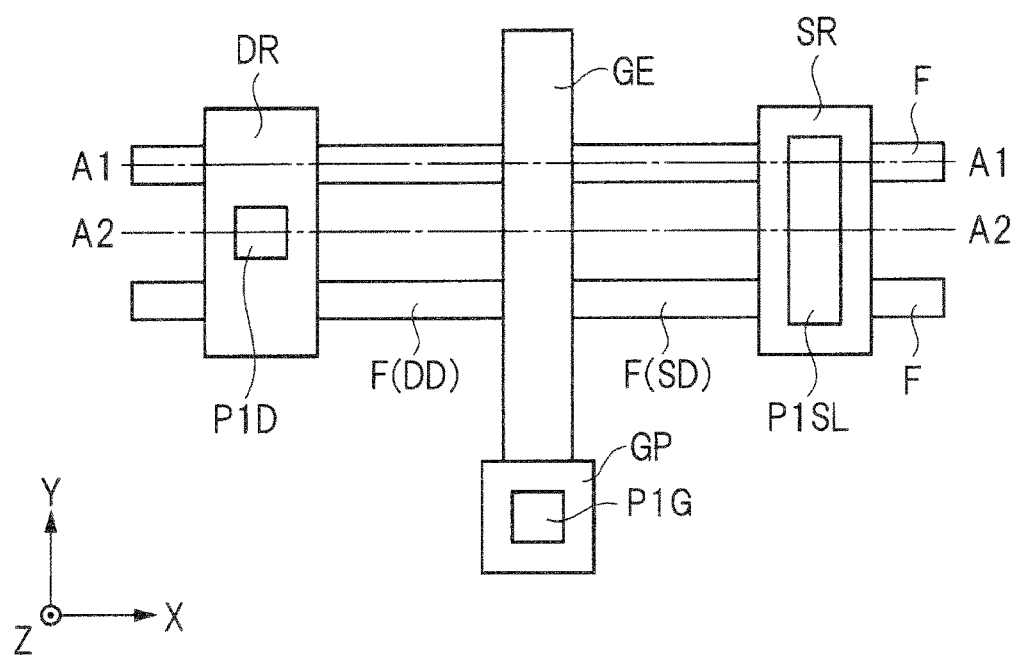
FIG. 34 is a plan view showing a configuration of a semiconductor device of Fourth Embodiment.
Figure 35:
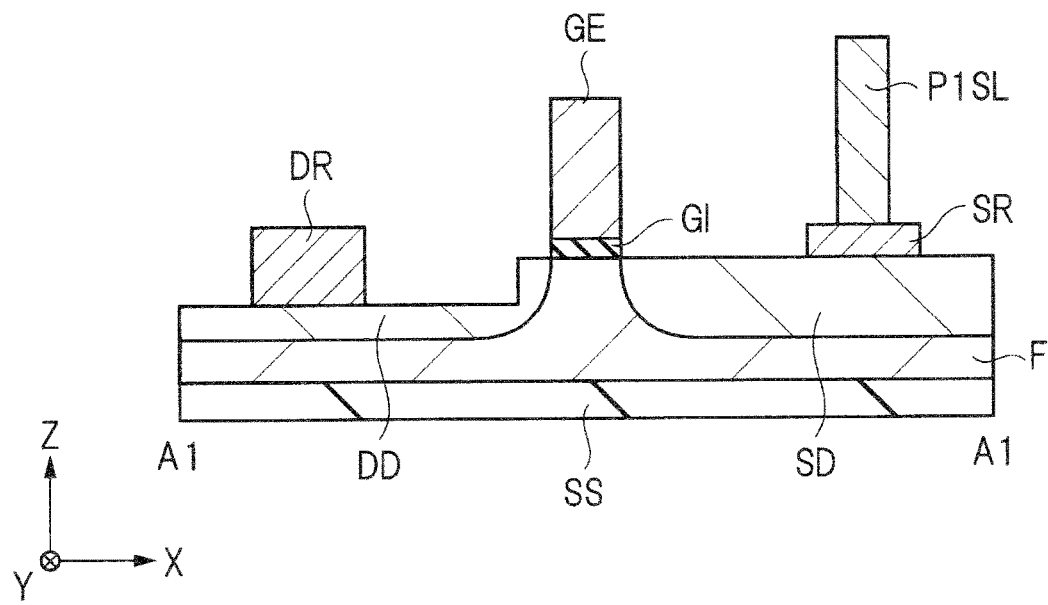
FIG. 35 is a cross-sectional view showing the configuration of the semiconductor device of Fourth Embodiment.
Figure 36:
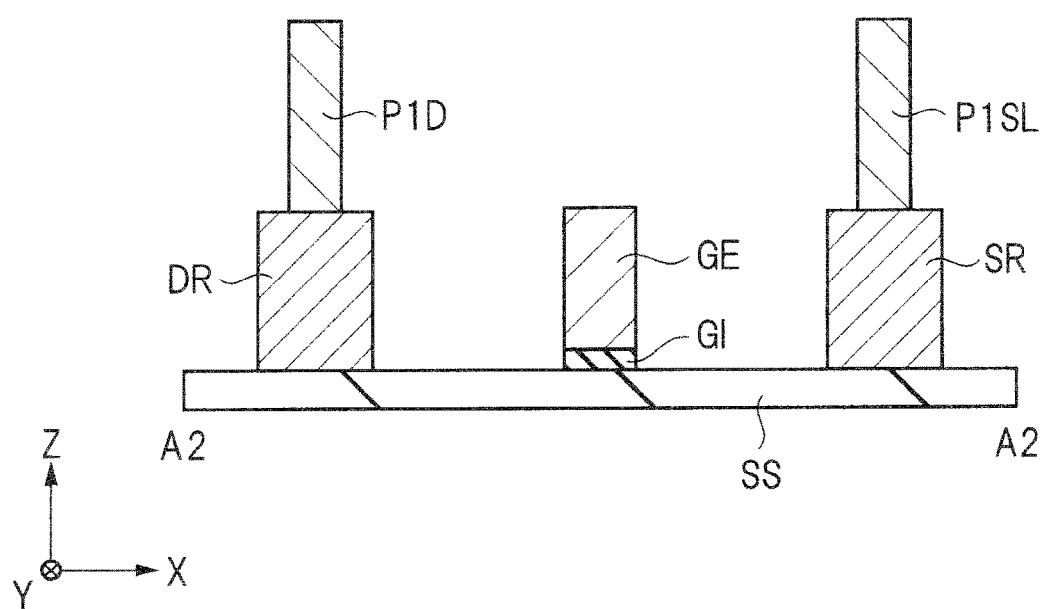
FIG. 36 is a cross-sectional view showing the configuration of the semiconductor device of Fourth Embodiment.

FIG. 34 is a plan view showing a configuration of a semiconductor device of the present embodiment. FIGS. 35 and 36 are cross-sectional views showing a configuration of the semiconductor device of the present embodiment. The cross-sectional view of FIG. 35 corresponds, for example, to a cross-section taken along line A1-A1 in the plan view of FIG. 34, and the cross-sectional view of FIG. 36 corresponds, for example, to a cross-section taken along line A2-A2 in the plan view of FIG. 34.

According to the present embodiment also, as in the semiconductor device (FIGS. 31 to 33) of Third Embodiment, the height of the fin F on the drain side is lower than the height of the fin F on the source side (see FIG. 35). Further, the configuration of the semiconductor device of the present embodiment is similar to that of the semiconductor device (FIGS. 31 to 33) of Third Embodiment except for a shape of the source plug P1SL. Therefore, the shape of the source plug P1SL will be explained in detail.

As shown in FIG. 34, one source plug P1SL is arranged over the source region SR extending, over the two fins F, in the direction intersecting the fins F. The source plug P1SL is so arranged as to join regions in which two fins F and the source region SR cross over, respectively. The source plug P1SL has a rectangular shape having a long side in Y-direction. The length (width) of the side (short side) of the source plug P1SL in X-direction is about the same as the length of the side of the drain plug P1D in X-direction. However, the length of the side (long side) of the source plug P1SL in Y-direction is longer than the length of the side of the drain plug P1D in Y-direction. Therefore, a facing area of the source plug P1SL and the gate electrode GE becomes larger than a facing area of the drain plug P1D and the gate electrode GE. In other words, a line segment (facing region) in Y-direction where the source plug P1SL and the gate electrode GE overlap becomes larger than a line segment (facing region) in Y-direction where the drain plug P1D and the gate electrode GE overlap.

According to such a configuration, of the gate-source capacitance, i.e., capacitance between the gate electrode GE and the source diffusion layer SD, capacitance between the gate electrode GE and the source region SR, and capacitance between the gate electrode GE and the source plug P1SL, the capacitance between the gate electrode GE and the source plug P1SL becomes larger than that of the semiconductor device (FIGS. 31 to 33) of Third Embodiment. As a result, stability of circuit operation can be improved.

Further, the semiconductor device of the present embodiment can be formed through processes similar to those of the semiconductor device of Third Embodiment.

Moreover, as explained in Application Examples 1 and 2 of First Embodiment, in the semiconductor device using two or more fins F, the height of the fin F on the drain side may be lower than the height of the fin F on the source side.

(Fifth Embodiment) In the semiconductor device (FIGS. 1 to 5) of First Embodiment, over the two fins F, the drain region DR extending in the direction intersecting the fins F is provided. However, the drain region DR may be divided.

Figure 37:
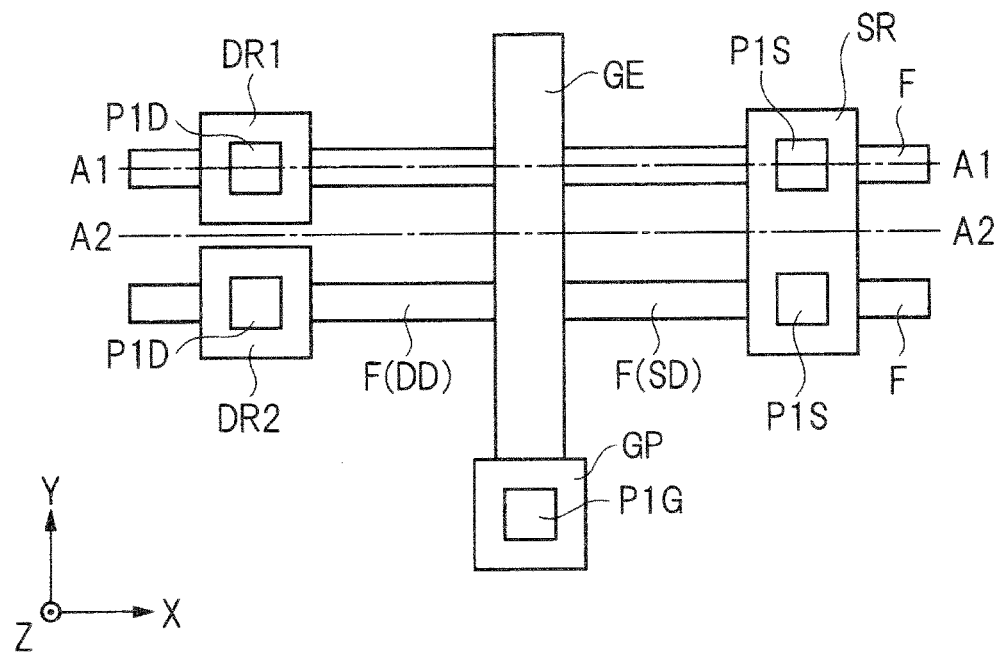
FIG. 37 is a plan view showing a configuration of a semiconductor device of Fifth Embodiment.
Figure 38:
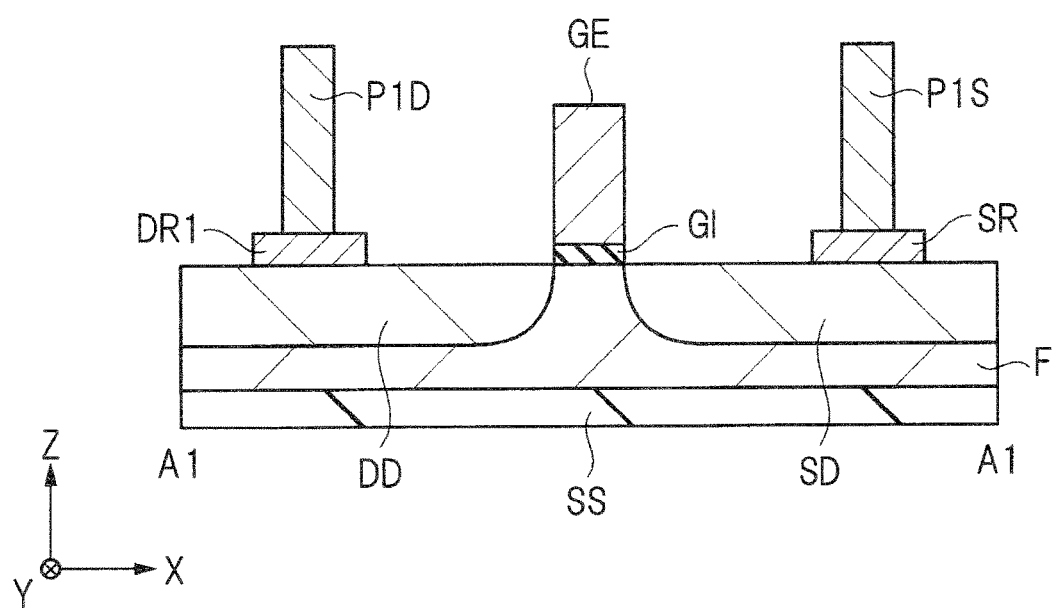
FIG. 38 is a cross-sectional view showing the configuration of the semiconductor device of Fifth Embodiment.
Figure 39:
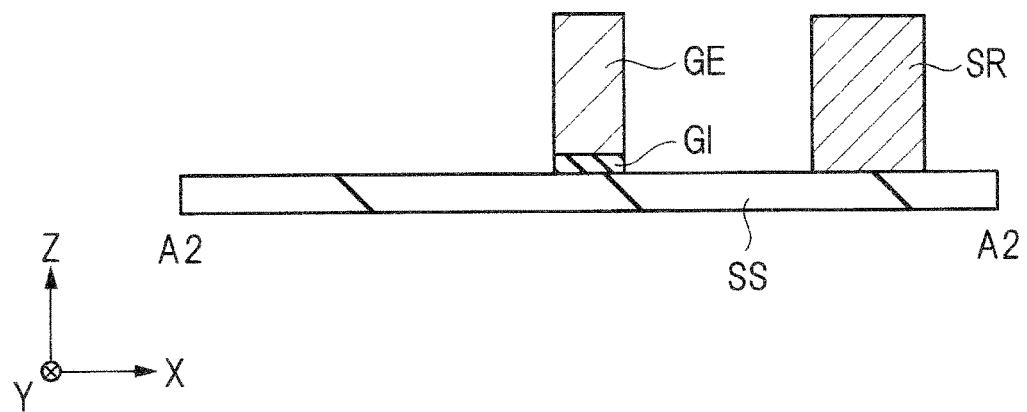
FIG. 39 is a cross-sectional view showing the configuration of the semiconductor device of Fifth Embodiment.

FIG. 37 is a plan view showing a configuration of a semiconductor device of the present embodiment. FIGS. 38 and 39 are cross-sectional views showing the configuration of the semiconductor device of the present embodiment. The cross-sectional view of FIG. 38 corresponds, for example, to a cross-section taken along line A1-A1 in the plan view of FIG. 37, and the cross-sectional view of FIG. 39 corresponds, for example, to a cross-section taken along line A2-A2 in the plan view of FIG. 37.

As shown in FIG. 37, the gate electrode GE extending, over the two fins F, in the direction intersecting the fins F is provided. Over the source diffusion layer SD on one side of the gate electrode GE, the source region SR extending in the direction intersecting the fin F is provided. Over the drain diffusion layer DD on the other side of the gate electrode GE, the drain region (DR) extending in the direction intersecting the fin F is provided. However, according to the present embodiment, the drain region (DR1, DR2) is arranged in a divided manner over the respective two fins F.

Over the source region SR, two source plugs P1S are arranged. The two source plugs P1S are arranged over regions, respectively, in which the two fins F and the source region SR cross over. Also, over the two drain regions DR1 and DR2, the drain plugs P1D are arranged, respectively.

Thus, according to the present embodiment, of the gate-drain capacitance, i.e., capacitance between the gate electrode GE and the drain diffusion layer DD, capacitance between the gate electrode GE and the drain region DR, and capacitance between the gate electrode GE and the drain plug P1D, the capacitance between the gate electrode GE and the drain region DR can be reduced. Therefore, the gate-drain capacitance can be made smaller than the gate-source capacitance (the capacitance between the gate electrode GE and the source diffusion layer SD, the capacitance between the gate electrode GE and the source region SR, and the capacitance between the gate electrode GE and the source plug P1S) (see also FIGS. 38 and 39).

Further, the semiconductor device of the present embodiment can be formed through processes similar to those of the semiconductor device of First Embodiment.

<APPLICATION EXAMPLE> In the above semiconductor device (FIGS. 37 to 39), the two fins F are used. However, two or more fins F may be used.

Figure 40:
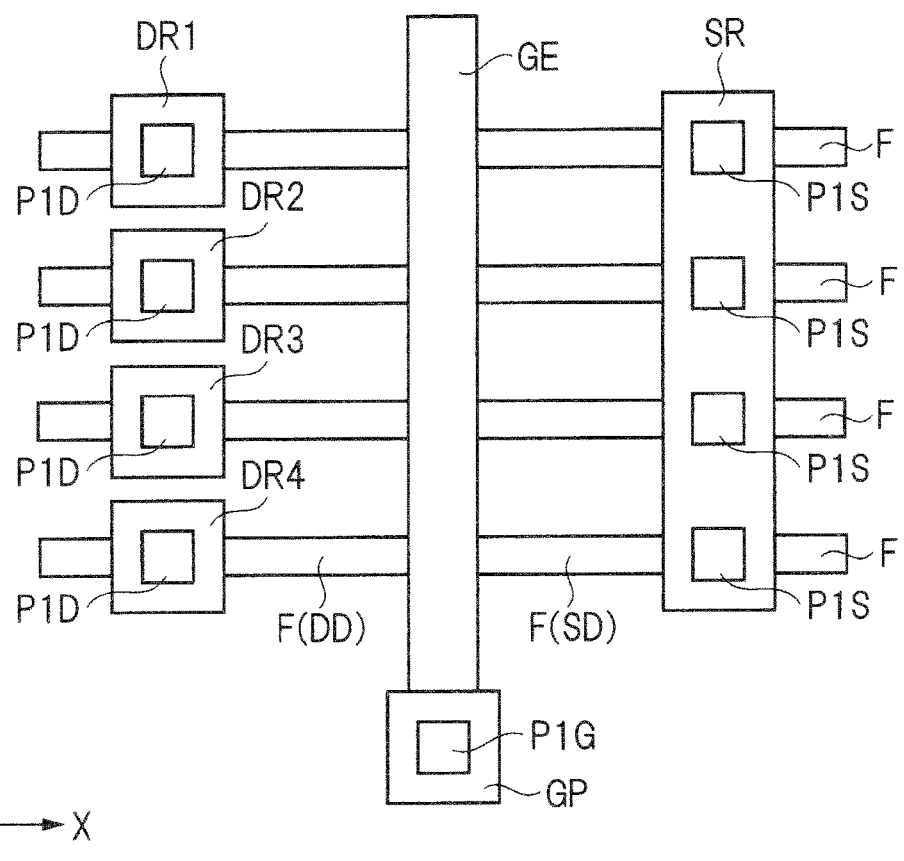
FIG. 40 is a plan view showing a configuration of a semiconductor device of Application Example of Fifth Embodiment.

FIG. 40 is a plan view showing a configuration of a semiconductor device of Application Example of the present Embodiment. Further, the configuration of the semiconductor device of the present application example is similar to that of the above semiconductor device (FIGS. 37 to 39) except for the number of fins F.

As shown in FIG. 40, the gate electrode GE extending, over the four fins F, in the direction intersecting the fins F is provided. Over the source diffusion layer SD on one side of the gate electrode GE, the source region SR extending in the direction intersecting the fin F is provided. Over the drain diffusion layer DD on the other side of the gate electrode GE, the drain region (DR) extending in the direction intersecting the fin F is provided. However, according to the present embodiment, the drain region (DR1, DR2, DR3, DR4) is arranged in a divided manner over the respective four fins.

Also, over the source region SR, four source plugs P1S are arranged. The four source plugs P1S are arranged over regions, respectively, in which the four fins F and the source region SR cross over. Also, over four drain regions DR1, DR2, DR3, and DR4, the drain plugs P1D are arranged, respectively.

Thus, according to the present embodiment, of the gate-drain capacitance, i.e., capacitance between the gate electrode GE and the drain diffusion layer DD, capacitance between the gate electrode GE and the drain region DR, and capacitance between the gate electrode GE and the drain plug P1D, the capacitance between the gate electrode GE and the drain region DR can be reduced. Therefore, the gate-drain capacitance can be made smaller than the gate-source capacitance (the capacitance between the gate electrode GE and the source diffusion layer SD, the capacitance between the gate electrode GE and the source region SR, and the capacitance between the gate electrode GE and the source plug P1S).

Further, the semiconductor device of the present application example can be formed through processes similar to those of the semiconductor device of First Embodiment. In this case also, the fins may be formed by using the double patterning method.

(Sixth Embodiment) In the semiconductor device (FIGS. 37 to 39) of Fifth Embodiment, the two source plugs P1S are provided. That is, the source plugs P1S are provided over regions, respectively, in which the two fins F and the source region SR cross over. However, a long source plug P1SL in the shape of two source plugs P1S jointed together may be provided.

Figure 41:
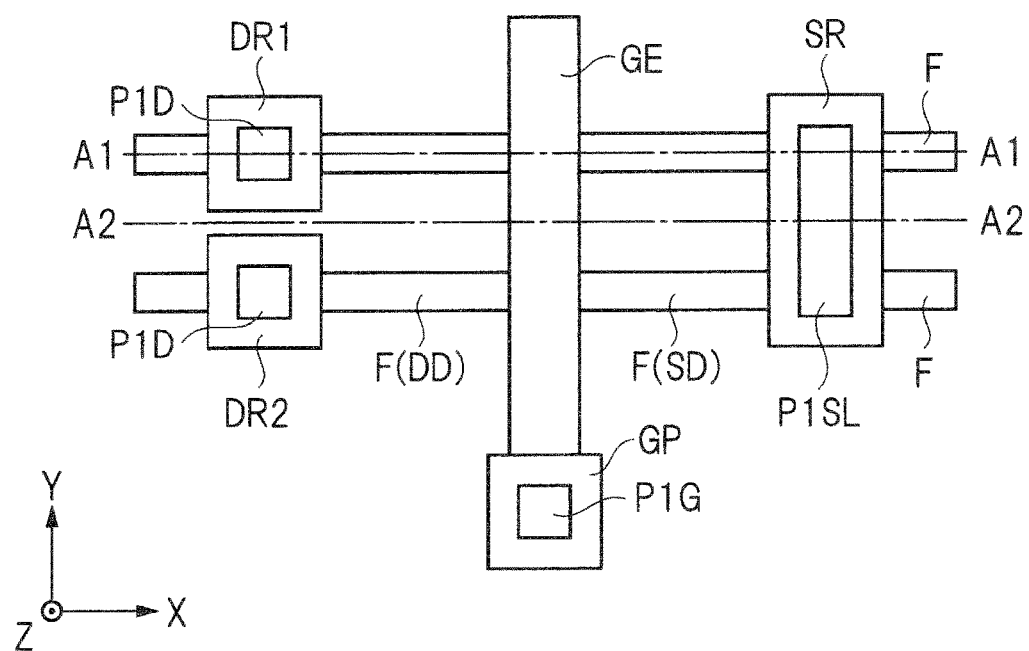
FIG. 41 is a plan view showing a configuration of a semiconductor device of Sixth Embodiment.
Figure 42:
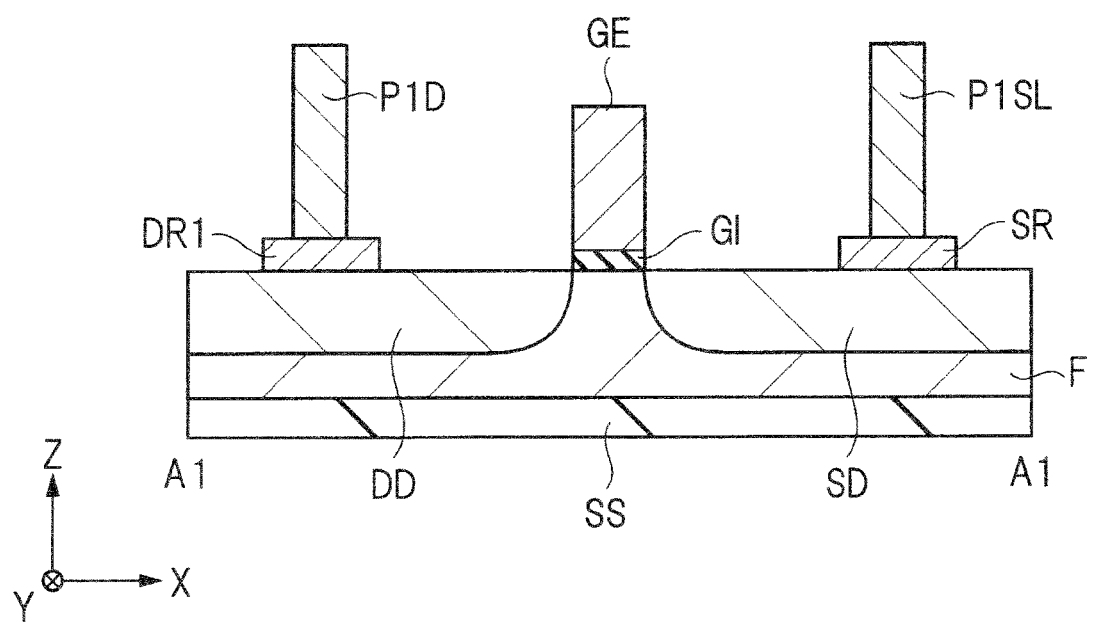
FIG. 42 is a cross-sectional view showing the configuration of the semiconductor device of Sixth Embodiment.
Figure 43:
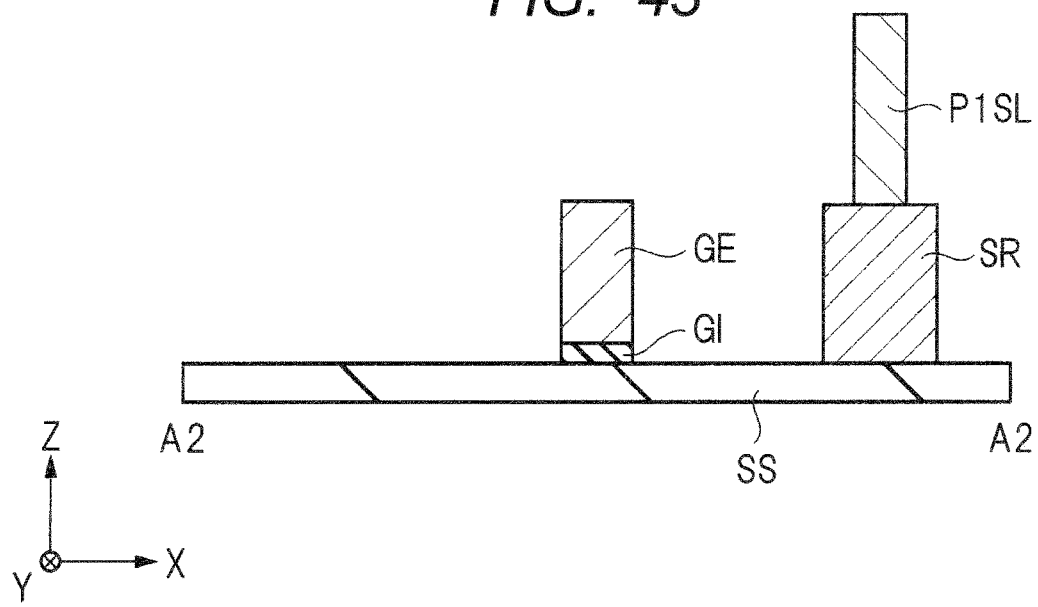
FIG. 43 is a cross-sectional view showing the configuration of the semiconductor device of Sixth Embodiment.

FIG. 41 is a plan view showing a configuration of a semiconductor device of the present embodiment. FIGS. 42 and 43 are cross-sectional views showing the configuration of the semiconductor device of the present embodiment. The cross-sectional view of FIG. 42 corresponds, for example, to a cross-section taken along line A1-A1 in the plan view of FIG. 41 and the cross-sectional view of FIG. 43 corresponds, for example, to a cross-section taken along line A2-A2 in the plan view of FIG. 41.

Further, the configuration of the semiconductor device of the present embodiment is similar to that of the semiconductor device (FIGS. 37 to 39) of Fifth Embodiment except for a shape of the source plug P1SL. Therefore, the shape of the source plug P1SL will be explained in detail.

As shown in FIG. 41, one source plug P1SL is arranged over the source region SR extending, over the two fins F, in the direction intersecting the fins F. The source plug P1SL is so arranged as to join regions in which the two fins F and the source region SR cross over, respectively. The source plug P1SL has a rectangular shape having a long side in Y-direction. The length (width) of the side (short side) of the source plug P1SL in X-direction is about the same as the length of the side of the drain plug P1D in X-direction. However, the length of the side (long side) of the source plug P1SL in Y-direction is longer than the length of the side of the drain plug P1D in Y-direction. Therefore, a facing area of the source plug P1SL and the gate electrode GE becomes larger than a facing area of the drain plug P1D and the gate electrode GE. In other words, a line segment (facing region) in Y-direction where the source plug P1SL and the gate electrode GE overlap becomes larger than a line segment (facing region) in Y-direction where the drain plug P1D and the gate electrode GE overlap.

According to such a configuration, of the gate-source capacitance, i.e., capacitance between the gate electrode GE and the source diffusing layer SD, capacitance between the gate electrode GE and the source region SR, and capacitance between the gate electrode GE and the source plug P1SL, the capacitance between the gate electrode GE and the source plug P1SL becomes larger than that of the semiconductor device (FIGS. 37 to 39) of Fifth Embodiment (see also see FIGS. 42 and 43). As a result, stability of circuit operation can be improved.

Further, the semiconductor device of the present embodiment can be formed through processes similar to those of the semiconductor device of First Embodiment.

<APPLICATION EXAMPLE> In the above semiconductor device (FIGS. 41 to 43), the two fins F are used. However, two or more fins F may be used.

Figure 44:
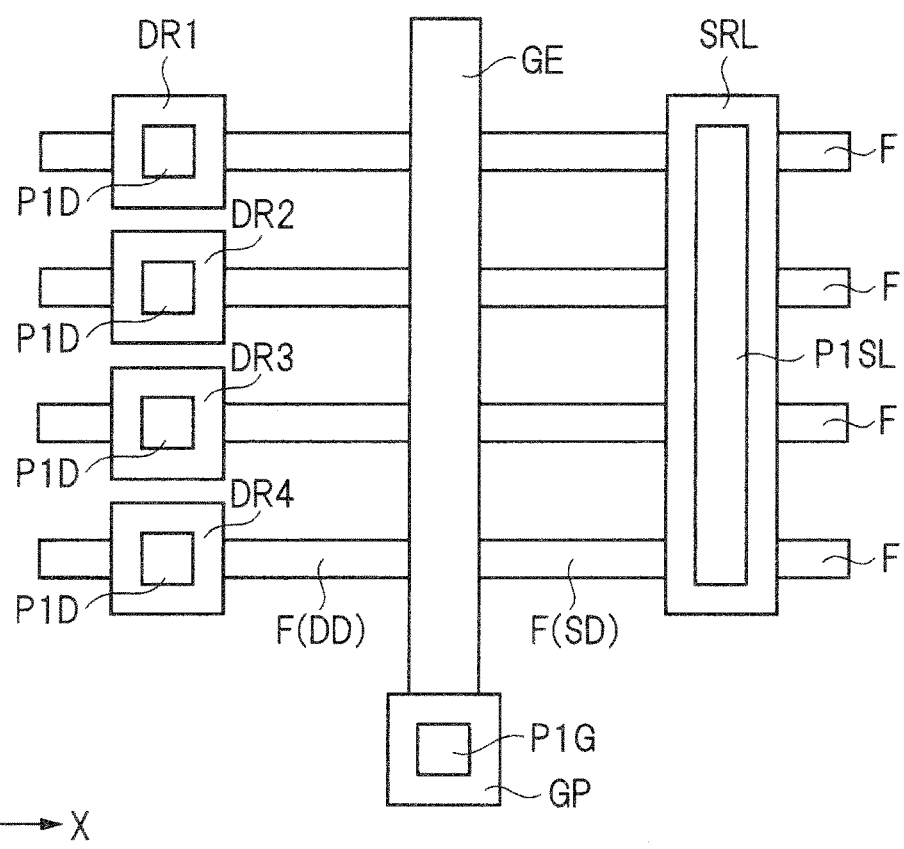
FIG. 44 is a plan view showing a configuration of a semiconductor device of Application Example of Sixth Embodiment.

FIG. 44 is a plan view showing a configuration of a semiconductor device of Application Example of the present embodiment. Also, the configuration of the semiconductor device of the present application example is similar to that of the above semiconductor device (FIGS. 41 to 43) except for the number of fins F.

As shown in FIG. 44, the gate electrode GE extending, over the four fins F, in the direction intersecting the fins F is provided. Over the source diffusion layer SD on one side of the gate electrode GE, the source region SR extending in the direction intersecting the fin F is provided. Over the drain diffusion layer DD on the other side of the gate electrode GE, the drain region (DR) extending in the direction intersecting the fin F is provided. However, according to the present embodiment, the drain region (DR1, DR2, DR3, DR4) is arranged in a divided manner over the respective four fins F.

Then, as shown in FIG. 44, one source plug P1SL is arranged over the source region SR extending, over the four fins F, in a direction intersecting the fins F. The source plug P1SL is so arranged as to join regions in which outermost fins F (an uppermost fin F and a lowermost fin F in FIG. 44) of the four fins F and the source region SR cross over, respectively. The source plug P1SL has a rectangular shape having a long side in Y-direction. The length (width) of the side (short side) of the source plug P1SL in X-direction is about the same as the length of the side of the drain plug P1D in X-direction. However, the length of the side (long side) of the source plug P1SL in Y-direction is longer than the length of the side of the drain plug P1D in Y-direction.

Over the drain region (DR1, DR2, DR3, DR4) arranged over the four fins F in a divided manner, the drain plugs P1D are arranged, respectively. A formation region of the drain plugs P1D (sum of formation regions of the four drain plugs P1D) is smaller than a formation region of the source plug P1SL. Further, a facing area of the source plug P1SL and the gate electrode GE is larger than a facing area of the four drain plugs P1D and the gate electrodes GE.

According to such a configuration, of the gate-source capacitance, i.e., capacitance between the gate electrode GE and the source diffusion layer SD, capacitance between the gate electrode GE and the source region SR, and capacitance between the gate electrode GE and the source plug P1 SL, the capacitance between the gate electrode GE and the source plug P1SL becomes larger than that of the semiconductor device (FIG. 24) of Application Example 1 of First Embodiment. As a result, stability of circuit operation can be improved.

Further, the semiconductor device of the present embodiment can be formed through processes similar to those of the semiconductor device of First Embodiment. In that case also, the fins may be formed by using the double patterning method.

(Seventh Embodiment) In the semiconductor device (FIGS. 37 to 39) of Fifth Embodiment where the drain region DR is arranged in a divided manner, a height of the fin F on the drain side may be lower than a height of the fin F on the source side.

Figure 45:
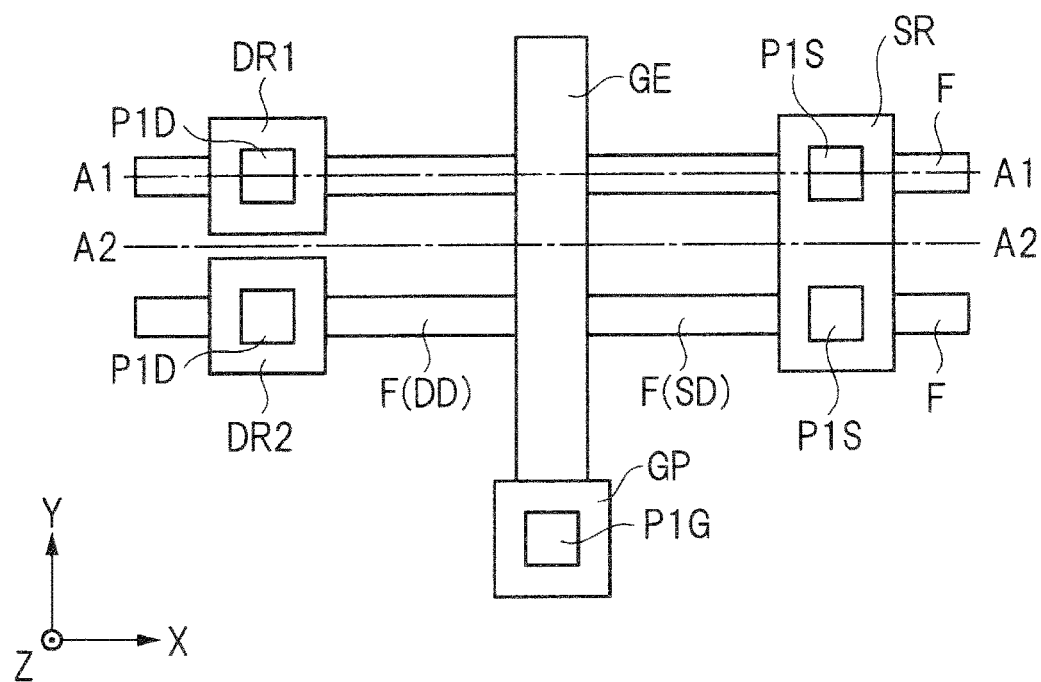
FIG. 45 is a plan view showing a configuration of a semiconductor device of Seventh Embodiment.
Figure 46:
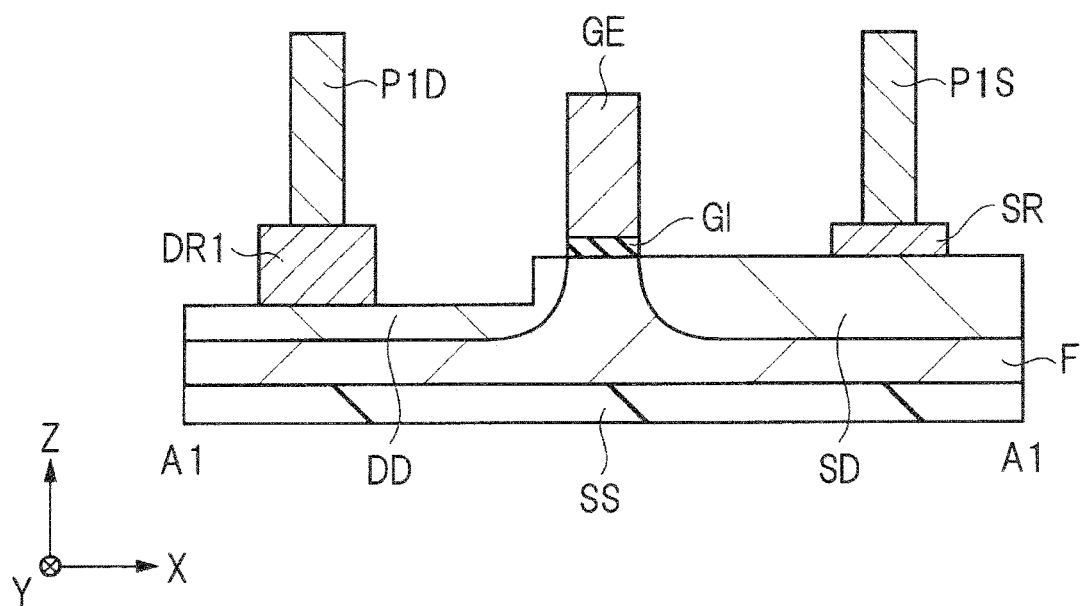
FIG. 46 is a cross-sectional view showing the configuration of the semiconductor device of Seventh Embodiment.
Figure 47:
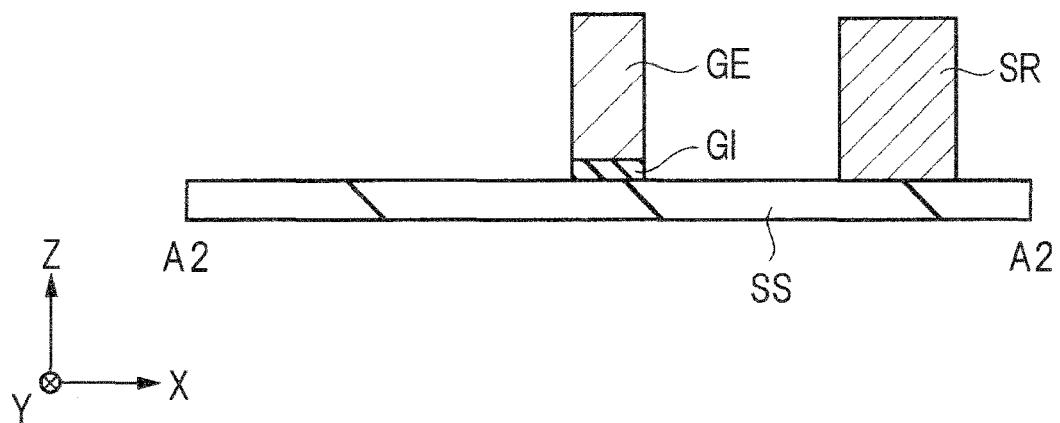
FIG. 47 is a cross-sectional view showing the configuration of the semiconductor device of Seventh Embodiment.

FIG. 45 is a plan view showing a configuration of a semiconductor device of the present embodiment. FIGS. 46 and 47 are cross-sectional views showing the configuration of the semiconductor device of the present embodiment. The cross-sectional view of FIG. 46 corresponds, for example, to a cross-section taken along line A1-A1 in the plan view of FIG. 45 and the cross-sectional view of FIG. 47 corresponds, for example, to a cross-section taken along line A2-A2 in the plan view of FIG. 45.

Further, the configuration of the semiconductor device of the present embodiment is similar to that of the semiconductor device (FIGS. 37 to 39) of Fifth Embodiment except for a height of the fin F on the drain side. Therefore, the shape of the fin F will be explained in detail.

The plan view of the present embodiment is similar to the plan view of Fifth Embodiment. That is, as shown in FIG. 45, the gate electrode GE extending, over the two fins F, in the direction intersecting the fins F is provided. Over the source diffusion layer SD on one side of the gate electrode GE, the source region SR extending in the direction intersecting the fin F is provided. Over the drain diffusion layer DD on the other side of the gate electrode GE, the drain region (DR) extending in the direction intersecting the fin F is provided. However, according to the present embodiment, the drain region (DR1, DR2) is arranged in a divided manner over the respective two fins F.

Further, over the source region SR, two source plugs P1S are arranged. The two source plugs P1S are arranged over regions, respectively, in which the two fins F and the source region SR cross over. Also, the drain plugs P1D are arranged over the drain regions DR1 and DR2, respectively.

Thus, according to the present embodiment, of the gate-drain capacitance, i.e., capacitance between the gate electrode GE and the drain diffusion layer DD, capacitance between the gate electrode GE and the drain region DR, and capacitance between the gate electrode GE and the drain plug P1D, the capacitance between the gate electrode GE and the drain region DR can be reduced. Therefore, the gate-drain capacitance can be made smaller than the gate-source capacitance (the capacitance between the gate electrode GE and the source diffusion layer SD, the capacitance between the gate electrode GE and the source region SR, and the capacitance between the gate electrode GE and the source plug P1S).

Further, in the present embodiment, as shown in FIG. 46, the height of the fin F on the drain side is lower than the height of the fin F on the source side. According to such a configuration, of the gate-drain capacitance, i.e., capacitance between the gate electrode GE and the drain diffusion layer DD, capacitance between the gate electrode GE and the drain region DR, and capacitance between the gate electrode GE and the drain plug P1D, the capacitance between the gate electrode GE and the drain diffusion layer DD can be reduced. Therefore, the gate-drain capacitance can be made smaller than the gate-source capacitance (the capacitance between the gate electrode GE and the source diffusion layer SD, the capacitance between the gate electrode GE and the source region SR, and the capacitance between the gate electrode GE and the source plug P1S). As a result, the Miller effect-based circuit delay can be further suppressed and stability of circuit operation can be further improved.

The semiconductor device of the present embodiment can be formed through processes similar to those of the semiconductor device of First Embodiment. However, in the present embodiment, after forming the fins F each of which has a rectangular parallelepiped shape, the height of the fin F on the drain side is made lower than the height of the fin F on the source side by etching an upper portion of the fin F on the drain region DR side.

(Eighth Embodiment) In the semiconductor device (FIGS. 41 to 43) of Sixth Embodiment where the drain region DR is arranged in a divided manner, the height of the fin F on the drain side may be lower than the height of the fin F on the source side.

Figure 48:
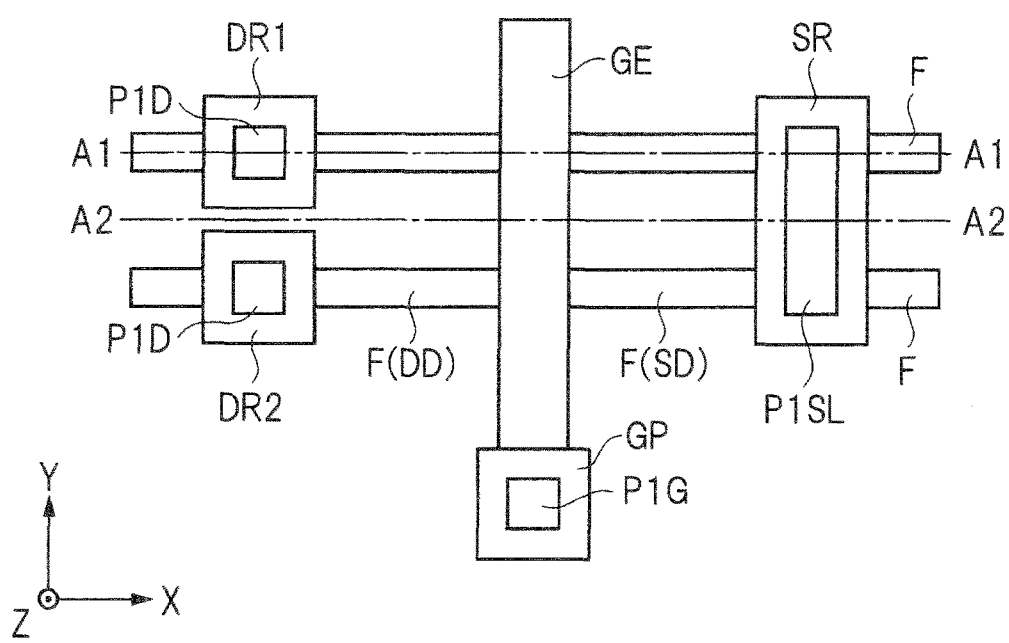
FIG. 48 is a plan view showing a configuration of a semiconductor device of Eighth Embodiment.
Figure 49:
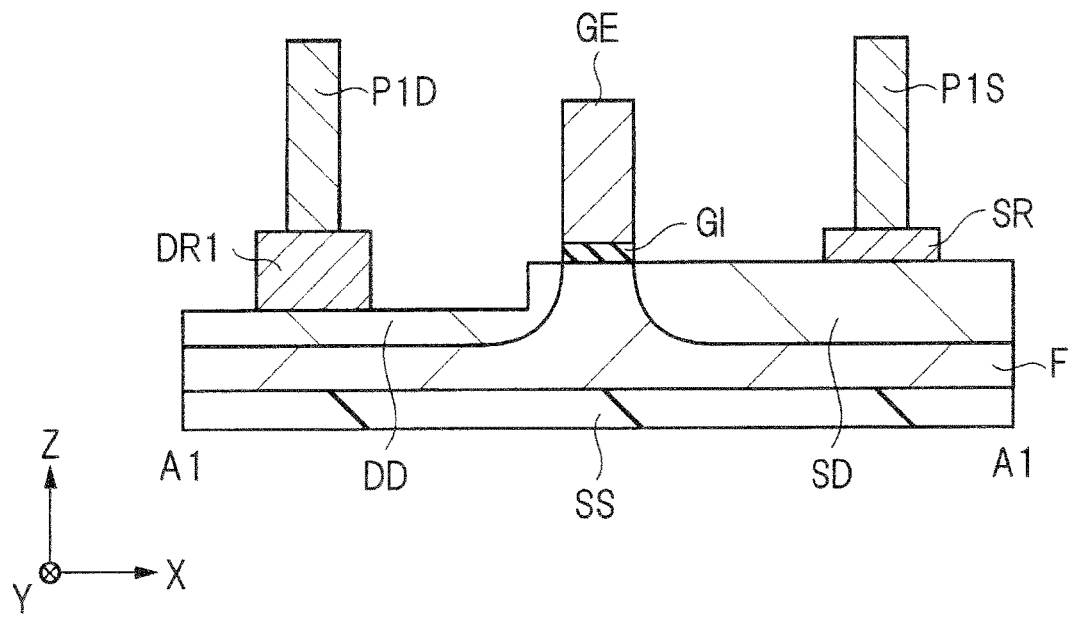
FIG. 49 is a cross-sectional view showing the configuration of the semiconductor device of Eighth Embodiment.
Figure 50:
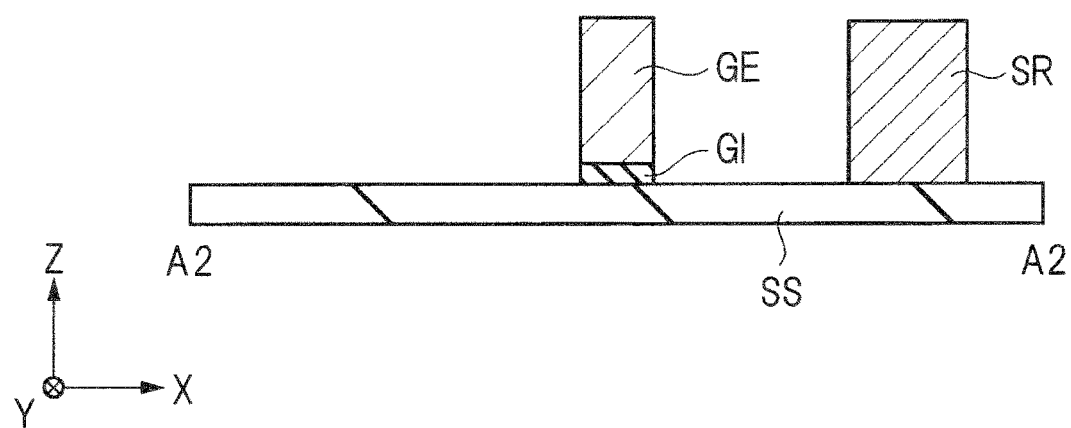
FIG. 50 is a cross-sectional view showing the configuration of the semiconductor device of Eighth Embodiment.

FIG. 48 is a plan view showing a configuration of a semiconductor device of the present embodiment. FIGS. 49 and 50 are cross-sectional views showing the configuration of the semiconductor device of the present embodiment. The cross-sectional view of FIG. 49 corresponds, for example, to a cross-section taken along line A1-A1 in the plan view of FIG. 48 and the cross-sectional view of FIG. 50 corresponds, for example, to a cross-section taken along line A2-A2 in the plan view of FIG. 48.

Further, the configuration of the semiconductor device of the present embodiment is similar to that of the semiconductor device (FIGS. 41 to 43) of Sixth Embodiment except for a height of the fin F on the drain side. Therefore, the shape of the fin F will be explained in detail.

The plan view of the present embodiment is similar to the plan view of Sixth Embodiment. That is, as shown in FIG. 48, the gate electrode GE extending in the direction intersecting the fin F is provided over the two fins F. Over the source diffusion layer SD on one side of the gate electrode GE, the source region SR extending in the direction intersecting the fin F is provided. Over the drain diffusion layer DD on the other side of the gate electrode GE, the drain region (DR) extending in the direction intersecting the fin F is provided. However, in the present embodiment, the drain region (DR1, DR2) is arranged in a divided manner over respective two fins F.

Then, over the source region SR, one source plug P1SL is arranged. The source plug P1SL is so arranged as to join regions in which the two fins F and the source region SR cross over, respectively. The source plug P1SL has a rectangular shape having a long side in Y-direction. The length (width) of the side (short side) of the source plug P1SL in X-direction is about the same as the length of the side of the drain plug P1D in X-direction. However, the length of the side (long side) of the source plug P1SL in Y-direction is longer than the length of the side of the drain plug P1D in Y-direction. Therefore, a facing area of the source plug P1SL and the gate electrode GE becomes larger than a facing area of the drain plug P1D and the gate electrode GE. In other words, a line segment (facing region) in Y-direction where the source plug P1SL and the gate electrode GE overlap becomes larger than a line segment (facing region) in Y-direction where the drain plug P1D and the gate electrode GE overlap.

Thus, according to the present embodiment, of the gate-drain capacitance, i.e., capacitance between the gate electrode GE and the drain diffusion layer DD, capacitance between the gate electrode GE and the drain region DR, and capacitance between the gate electrode GE and the drain plug P1D, the capacitance between the gate electrode GE and the drain region DR can be decreased. Therefore, the gate-drain capacitance can be made smaller than the gate-source capacitance (the capacitance between the gate electrode GE and the source diffusion layer SD, the capacitance between the gate electrode GE and the source region SR, and the capacitance between the gate electrode GE and the source plug P1SL).

Furthermore, according to the present embodiment, as shown in FIG. 49, the height of the fin F on the drain side is lower than the height of the fin F on the source side. With this configuration, of the gate-drain capacitance, i.e., capacitance between the gate electrode GE and the drain diffusion layer DD, capacitance between the gate electrode GE and the drain region DR, and capacitance between the gate electrode GE and the drain plug P1D, the capacitance between the gate electrode GE and the drain diffusion layer DD can be decreased. As a result, the gate-drain capacitance can be made smaller than the gate-source capacitance (the capacitance between the gate electrode GE and the source diffusion layer SD, the capacitance between the gate electrode GE and the source region SR, and the capacitance between the gate electrode GE and the source plug P1 SL). Therefore, the Miller effect-based circuit delay can be further suppressed and stability of circuit operation can be further improved.

The semiconductor device of the present embodiment can be formed through processes similar to those of the semiconductor device of First Embodiment. However, in the present embodiment, after forming the fins F each having a rectangular parallelepiped shape, the height of the fin F on the drain side is made lower than the height of the fin F on the source side by etching an upper portion of the fin F on the drain region DR side.

As above, the invention achieved by the present inventors is specifically explained based on the embodiments thereof, but the present invention is not limited to these embodiments. Needless to say, it may be variously changeable within the range that does not depart from the gist thereof.

For example, as described above, in the semiconductor device using two or more fins F explained in Application Examples 1 and 2 of First Embodiment, there may be adopted a configuration where the height of the fin F on the drain side is lower than the height of the fin F on the source side. Moreover, in the above embodiment, two or four fins F are shown by way of example. However, three fins, or five or more fins may be provided. Also, in the embodiments described above, the fin F and the drain region DR as well as the fin F and the source region SR are formed using different materials. However, they may be integrally formed in a single layer. Further, in the embodiments described above, the distance between the gate electrode GE and the drain region DR is about the same as the distance between the gate electrode GE and the source region SR. However, the distance between the gate electrode GE and the drain region DR may be longer than the distance between the gate electrode GE and the source region SR. Still further, the manufacturing processes of the semiconductor device are described in First Embodiment by way of examples, and the semiconductor device according to the embodiments described above may be formed using other processes. Still further, the height of each of the members configuring the semiconductor device is described by way of example, and it is possible to modify, as required, the heights of the drain region DR, the source region SR, the gate electrode GE, the drain plug P1D, and the source plug P1S, as well as relative relationship among those heights.

What is claimed is:

1. A semiconductor device, comprising:
a first fin having a rectangular parallelepiped shape extending in a first direction;
a second fin having a rectangular parallelepiped shape arranged being spaced from and parallel to the first fin;
a gate electrode arranged over the first and second fins via a gate insulating film and extending in a second direction intersecting the first direction;
a first drain diffusion layer formed in the first fin located on one side of the gate electrode;
a first source diffusion layer formed in the first fin located on the other side of the gate electrode;
a second drain diffusion layer formed in the second fin located on one side of the gate electrode;
a second source diffusion layer formed in the second fin located on the other side of the gate electrode;
a drain region arranged over the first and second drain diffusion layers and extending in the second direction;
a source region arranged over the first and second source diffusion layers and extending in the second direction;
a first drain plug formed over the drain region; and
a first source plug formed over the source region,
wherein a first surface of the first fin on one side of the gate electrode is lower than a second surface of the first fin on the other side of the gate electrode, and
wherein the first surface and the second surface face a same direction.

2. The semiconductor device according to claim 1 having a second source plug formed over the source region being spaced from the first source plug,
wherein, so as to correspond to a region between the first source plug and the second source plugs, the first drain plug is arranged in a displaced manner so that its position in the second direction may not overlap with the first source plug or the second source plug.

3. The semiconductor device according to claim 2, wherein the first source plug is formed over the region in which the first fin and the source region cross over and the second source plug is formed over the region in which the second fin and the source region cross over.

4. The semiconductor device according to claim 2, wherein the first drain plug does not overlap the first source plug in the second direction and the first drain plug does not overlap the second source plug in the second direction.

5. The semiconductor device according to claim 1, wherein the gate electrode extends from the second surface of the first fin on the other side of the gate electrode.

6. The semiconductor device according to claim 1, wherein the first source plug extends in the second direction from the first fin to the second fin along the source region.

7. A semiconductor device, comprising:
a first fin having a rectangular parallelepiped shape extending in a first direction;
a second fin having a rectangular parallelepiped shape arranged being spaced from and parallel to the first fin;
a gate electrode arranged over the first and second fins via a gate insulating film and extending in a second direction intersecting the first direction;
a first drain diffusion layer formed in the first fin located on one side of the gate electrode;
a first source diffusion layer formed in the first fin located on the other side of the gate electrode;
a second drain diffusion layer formed in the second fin located on one side of the gate electrode;
a second source diffusion layer formed in the second fin located on the other side of the gate electrode;

a drain region arranged over the first and second drain diffusion layers and extending in the second direction;
a source region arranged over the first and second source diffusion layers and extending in the second direction;
a first drain plug formed over the drain region; and
a first source plug formed over the source region,
a second source plug formed over the source region being spaced from the first source plug,
wherein a surface of the first fin on one side of the gate electrode is lower than a surface of the first fin on the other side of the gate electrode, and
wherein, so as to correspond to a region between the first source plug and the second source plugs, the first drain plug is arranged in a displaced manner so that its position in the second direction may not overlap with the first source plug or the second source plug.

* * * * *